US012615729B2

(12) United States Patent
Lee et al.

(10) Patent No.:  US 12,615,729 B2
(45) Date of Patent:  Apr. 28, 2026

(54) ELECTRONIC DEVICE INCLUDING FLEXIBLE DISPLAY

(71) Applicant: Samsung Electronics Co., Ltd., Suwon-si (KR)

(72) Inventors: Hosoon Lee, Suwon-si (KR); Wonsun Lee, Suwon-si (KR); Jinwan An, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 487 days.

(21) Appl. No.: 18/295,437

(22) Filed: Apr. 4, 2023

(65) Prior Publication Data

US 2023/0301004 A1     Sep. 21, 2023

Related U.S. Application Data

(63) Continuation of application No. PCT/KR2023/003582, filed on Mar. 17, 2023.

(30) Foreign Application Priority Data

Mar. 17, 2022  (KR) ........................ 10-2022-0033597
Jul. 18, 2022  (KR) ........................ 10-2022-0088287

(51) Int. Cl.
H05K 5/03       (2006.01)
B32B 7/12       (2006.01)
      (Continued)

(52) U.S. Cl.
CPC ................. H05K 5/03 (2013.01); B32B 7/12 (2013.01); B32B 17/04 (2013.01); B32B 17/10 (2013.01);
      (Continued)

(58) Field of Classification Search
CPC .. H05K 5/03; B32B 7/12; B32B 17/04; B32B 17/10; B32B 27/281; B32B 27/36;
      (Continued)

(56) References Cited

U.S. PATENT DOCUMENTS 9,164,547 B1 * 10/2015 Kwon ................... G06F 1/1652
9,870,031 B2 *  1/2018 Hsu ........................ G06F 1/1681
      (Continued)

FOREIGN PATENT DOCUMENTS

CN        208738308 U      4/2019
CN        111028684 A      4/2020
      (Continued)

OTHER PUBLICATIONS

International Search Report dated Jun. 27, 2023, issued in International Application No. PCT/KR2023/003582.
Extended European Search Report dated Oct. 9, 2024, issued in European Patent Application No. 23771135.3.

*Primary Examiner* — Charles S Chang
(74) *Attorney, Agent, or Firm* — Jefferson IP Law, LLP

(57)        ABSTRACT

An electronic device including a flexible display is provided. The electronic device includes a flexible display including a flexible display panel configured to display an image in a first direction, and a flexible window which is disposed in the first direction of the flexible display panel, based on the direction in which the image of the flexible display panel is displayed, and including a first part and a second part. The second part may include a flat-plate glass member. The first part may include multiple elongated glass members oriented parallel to the bending axis on a plane surface on which the flat-plate glass member is disposed in an unflexed state of the flexible window, and an optically transparent polymer disposed in a region positioned in the first direction and a region positioned in a second direction opposite to the first direction, coupled to the multiple elongated glass members.

23 Claims, 37 Drawing Sheets

(51) Int. Cl.

| | |
|---|---|
| *B32B 17/04* | (2006.01) |
| *B32B 17/10* | (2006.01) |
| *B32B 27/28* | (2006.01) |
| *B32B 27/36* | (2006.01) |
| *B32B 27/40* | (2006.01) |

(52) U.S. Cl.
CPC ............ *B32B 27/281* (2013.01); *B32B 27/36* (2013.01); *B32B 27/40* (2013.01); *B32B 2255/26* (2013.01); *B32B 2260/02* (2013.01); *B32B 2260/046* (2013.01); *B32B 2307/412* (2013.01); *B32B 2457/20* (2013.01)

(58) Field of Classification Search
CPC . B32B 27/40; B32B 2255/26; B32B 2260/02; B32B 2260/046; B32B 2307/412; B32B 2457/20; G02F 1/133305; G06F 1/1652; G06F 1/1681; H04M 1/0268
See application file for complete search history.

(56) References Cited

U.S. PATENT DOCUMENTS

| | | | |
|---|---|---|---|
| 10,838,467 B1 * | 11/2020 | Mehandjiysky | ...... G06F 1/1616 |
| 11,322,054 B2 | 5/2022 | Park et al. | |
| 11,355,717 B2 | 6/2022 | Wei | |
| 11,504,743 B2 | 11/2022 | Kim et al. | |
| 2021/0282285 A1 | 9/2021 | Sunwoo et al. | |
| 2021/0315116 A1 | 10/2021 | Sunwoo et al. | |
| 2022/0006038 A1 * | 1/2022 | Park | ............... H10K 59/873 |
| 2022/0201885 A1 * | 6/2022 | Nguyen | ............... G06F 1/1652 |

FOREIGN PATENT DOCUMENTS

| | | | |
|---|---|---|---|
| KR | 10-2019-0050325 A | 5/2019 | |
| KR | 10-2162567 B1 | 10/2020 | |
| KR | 10-2020-0127133 A | 11/2020 | |
| KR | 10-2021-0075354 A | 6/2021 | |
| KR | 10-2369002 B1 | 3/2022 | |

* cited by examiner

ELECTRONIC DEVICE INCLUDING FLEXIBLE DISPLAY

CROSS-REFERENCE TO RELATED APPLICATION(S)

This application is a continuation application, claiming priority under § 365(c), of an International application No. PCT/KR2023/003582, filed on Mar. 17, 2023, which is based on and claims the benefit of a Korean patent application number 10-2022-0033597, filed on Mar. 17, 2022, in the Korean Intellectual Property Office, and of a Korean patent application number 10-2022-0088287, filed on Jul. 18, 2022, in the Korean Intellectual Property Office, the disclosure of each of which is incorporated by reference herein in its entirety.

TECHNICAL FIELD

The disclosure relates to an electronic device. More particularly, the disclosure relates to an electronic device including a flexible display.

BACKGROUND ART

Electronic devices are gradually becoming slimmer, and are gradually being transformed into various shapes deviating from a uniform long rectangular shape. Electronic device may have a transformable structure which is convenient to carry and enables the use of a large screen. For example, an electronic device may have a structure (e.g., a foldable structure) having a flexible display disposed in multiple housings coupled by a hinge, or may have a structure (e.g., a rollable structure or a slidable structure) capable of changing a display area (e.g., a display region) of a flexible display through the support of housings which operate in a manner of sliding on each other.

A flexible display may include a flexible display panel (for example, a flexible organic light emitting diode (OLED)) and a flexible window disposed in a direction in which the screen of the flexible display is displayed to protect the flexible display from an external impact and inflow of foreign substances. A flexible window may include a transparent material, such as transparent polyimide or ultra-thin glass, having transparency and bendability.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

In a flexible window of a flexible display, which is made of transparent polyimide, damage such as a whitening or cracking due to plastic deformation may be caused by repetitive bending of the window. A flexible window made of ultra-thin glass has a thickness of about 30 to about 50 μm for easy bending thereof and thus has a weakened impact strength. Therefore, the flexible window may have an increased risk of damage when an external impact such as a pen drop is applied thereto. Further, when a bending radius of a flexible display increases, the resistance to the bending of the flexible display may also increase, so as to increase the risk that a screen protection film attached on the flexible window may be detached by buckling thereof.

Aspects of the disclosure are to address at least the above-mentioned problems and/or disadvantages and to provide at least the advantages described below. Accordingly, an aspect of the disclosure is to provide a flexible display having improved impact strength and low resistance to bending and an electronic device including the flexible display.

Additional aspects will be set forth in part in the description which follows and, in part, will be apparent from the description, or may be learned by practice of the presented embodiments.

Solution to Problem

In accordance with an aspect of the disclosure, an electronic device is provided. The electronic device includes a flexible display including a flexible display panel capable of being flexed and unflexed and configured to display an image in a first direction and is, and a flexible window which is disposed in the first direction of the flexible display panel, based on the direction in which the image of the flexible display panel is displayed, and including at least one first part capable of being flexed and unflexed around a bending axis and a second part. The second part may include a flat-plate glass member, and the first part may include multiple elongated glass members oriented parallel to the bending axis on a plane surface on which the flat-plate glass member is disposed in an unflexed state of the flexible window, and an optically transparent polymer disposed in a region positioned in the first direction of the multiple elongated glass members and a region positioned in a second direction opposite to the first direction in the first part, directly or indirectly coupled to the multiple elongated glass members, and having flexibility.

In various embodiments, the electronic device may be a foldable electronic device including at least one hinge and multiple sub-housings connected to be rotatable by the hinge. The flexible display may be disposed in the multiple sub-housings connected by the hinge, and the first part may be positioned in a region of the flexible display, which corresponds to the hinge.

In various embodiments, the electronic device may be a rollable electronic device including a first housing and a second housing into and out of which the first housing slides. The flexible display may have one end disposed in the first housing and the other end disposed in the second housing, and in case that the first housing slides into and slides out of the second housing, the other end may slide into and slide out of the second housing and the first part is positioned at the other end.

In various embodiments, the optically transparent polymer may have the same refractive index as the elongated glass members.

In various embodiments, a polymer coating layer coated on an outer perimeter surface of each of the elongated glass members may be included therein.

In various embodiments, the polymer coating layer may have an elastic modulus different from the optically transparent polymer.

In various embodiments, the electronic device may include a bundling member configured to surround the outside of the multiple elongated glass members.

In various embodiments, the bundling member may have an elastic modulus different from the optically transparent polymer.

In various embodiments, the flexible display may include an upper elongated glass member including the multiple elongated glass members arranged in an upper part of the flexible display, based on a direction in which the image of the flexible display is displayed, and a lower elongated glass member including the multiple elongated glass members arranged below the upper elongated glass member.

In various embodiments, the elongated glass members may include first elongated glass members and second elongated glass members having a smaller diameter compared to the first elongated glass members.

In various embodiments, the second elongated glass members may be arranged in gaps between the multiple first elongated glass members.

In accordance with another aspect of the disclosure, a flexible display is provided. The flexible display includes a flexible display panel capable of being flexed and unflexed and configured to display an image in a first direction and is, and a flexible window which is disposed in the first direction of the flexible display panel, based on the direction in which the image of the flexible display panel is displayed, and including at least one first part capable of being flexed and unflexed around a bending axis and a second part. The second part may include a flat-plate glass member, and the first part may include multiple elongated glass members oriented parallel to the bending axis on a plane surface on which the flat-plate glass member is disposed in an unflexed state of the flexible window, and an optically transparent polymer disposed in a region positioned in the first direction of the multiple elongated glass members and a region positioned in a second direction opposite to the first direction in the first part, directly or indirectly coupled to the multiple elongated glass members, and having flexibility.

In various embodiments, the optically transparent polymer may have the same refractive index as the elongated glass members.

In various embodiments, a polymer coating layer coated on an outer perimeter surface of each of the elongated glass members may be included therein.

In various embodiments, the polymer coating layer may have an elastic modulus different from the optically transparent polymer.

In various embodiments, the flexible may include a bundling member configured to surround the outside of the multiple elongated glass members.

In various embodiments, the bundling member may have an elastic modulus different from that of the optically transparent polymer.

In various embodiments, the flexible display may include an upper elongated glass member including the multiple elongated glass members arranged in an upper part of the flexible display, based on a direction in which the image of the flexible display is displayed, and a lower elongated glass member including the multiple elongated glass members arranged below the upper elongated glass member.

In various embodiments, the elongated glass members may include first elongated glass members and second elongated glass members having a smaller diameter compared to the first elongated glass members.

In various embodiments, the second elongated glass members may be arranged in gaps between the first elongated glass members.

Advantageous Effects of Invention

Various embodiments of the disclosure may provide an electronic device including a flexible display which includes multiple cylindrical glass members positioned on a first part and connected to each other by an optically clear resin (OCR), thereby improving the impact strength and rigidity thereof.

In addition, various embodiments of the disclosure may provide a flexible display including an optically transparent resin, by the viscoelastic behavior of which the surface of a flexible window thereof is deformed while supporting the shape deformation of a protective film at the time of bending thereof, so that the flexible display has a low resistance to the bending thereof and has a low possibility that the protective film may be detached from the surface of the flexible window.

In addition, various effects directly or indirectly identified through the document may be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which:

FIGS. 6A, 6B, 6C, 6D, 6E, 6F, 6G, 6H, 6I, and 6J are plan views and cross-sectional views showing a flexible display of a foldable electronic device according to various embodiments of the disclosure;

FIG. 8B is a cross-sectional view showing a flexible display according to an embodiment of the disclosure;

Throughout the drawings, like reference numerals will be understood to refer to like parts, components, and structures.

MODE FOR THE INVENTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
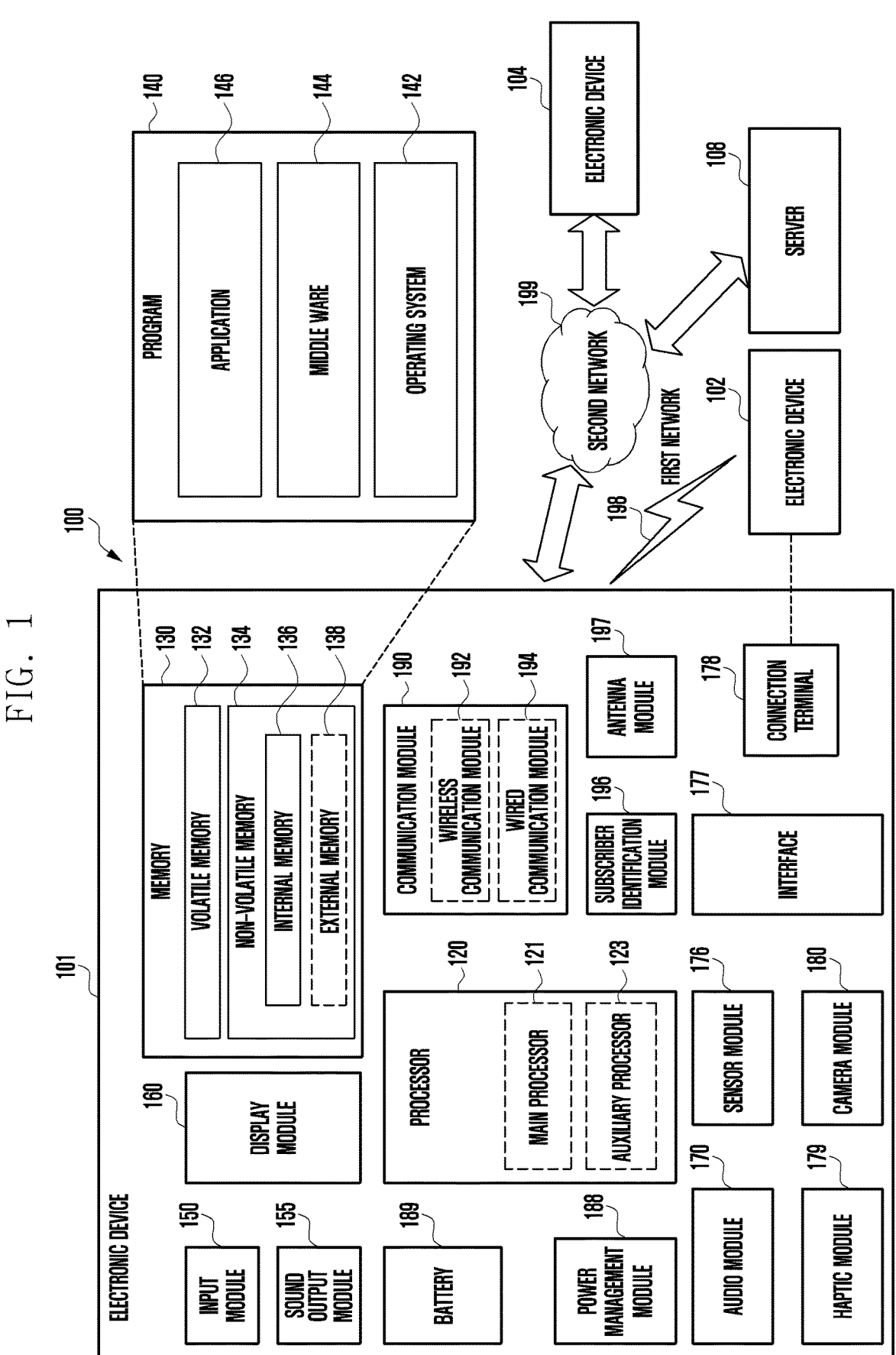
FIG. 1 is a block diagram of an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input 1module 150, a sound output 1module 155, a display 1module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the 11connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display 1module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input 1module 150 may receive a command or data to be used by another component (e.g., the processor 120) of the electronic device 101, from the outside (e.g., a user) of the electronic device 101. The input 1module 150 may include, for example, a microphone, a mouse, a keyboard, a key (e.g., a button), or a digital pen (e.g., a stylus pen).

The sound output 1module 155 may output sound signals to the outside of the electronic device 101. The sound output 1module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display 1module 160 may visually provide information to the outside (e.g., a user) of the electronic device 101. The display 1module 160 may include, for example, a display, a hologram device, or a projector and control circuitry to control a corresponding one of the displays, hologram device, and projector. According to an embodiment, the display 1module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input 1module 150, or output the sound via the sound output 1module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD- MIMO), array antenna, analog beam-forming, or large-scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
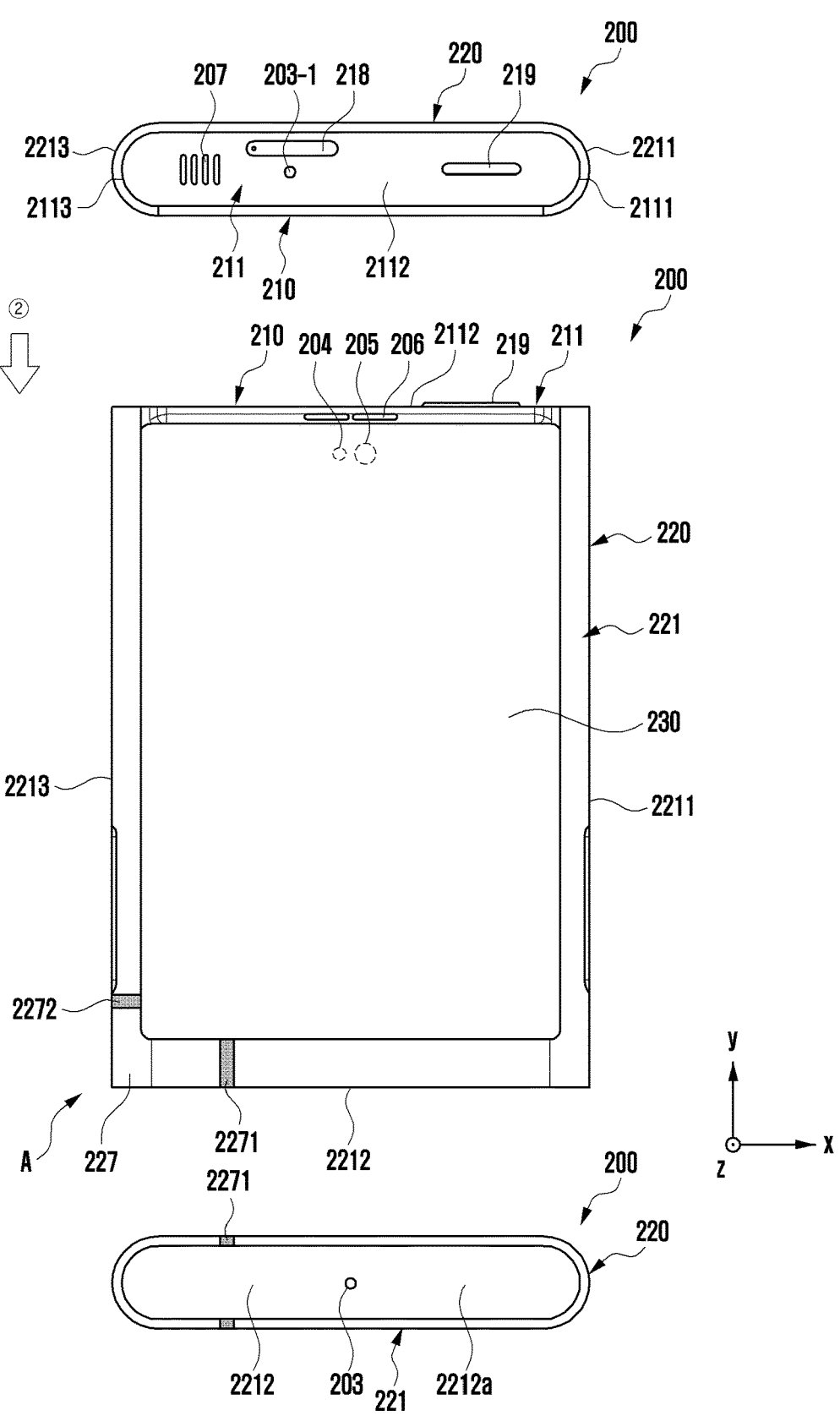
FIGS. 2A and 2B are views illustrating the front surface and the rear surface in a slide-in state of an electronic device according to various embodiments of the disclosure.
Figure 2B:
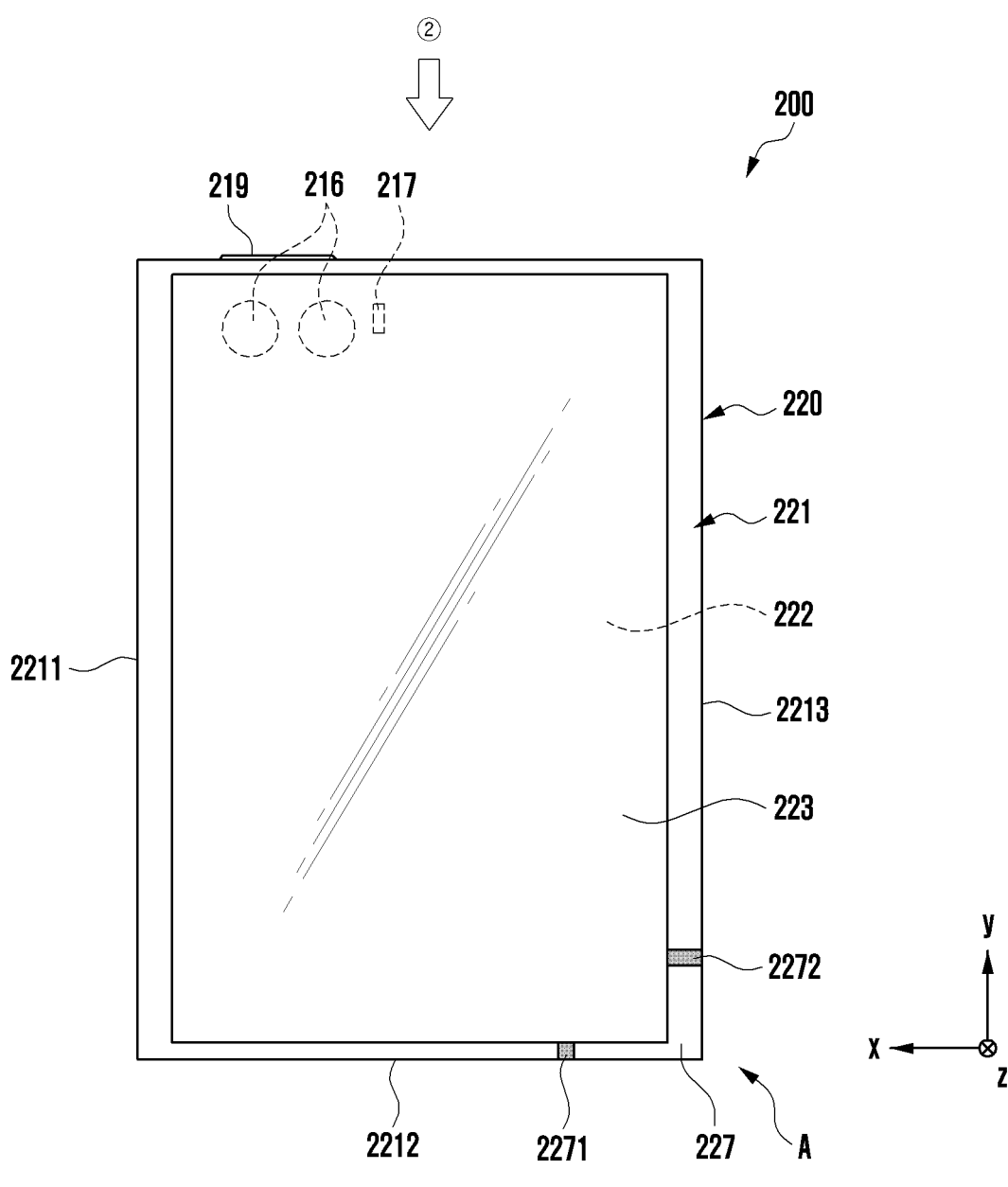

FIGS. 2A and 2B are views illustrating the front surface and the rear surface in a slide-in state of an electronic device according to various embodiments of the disclosure.

Figure 3A:
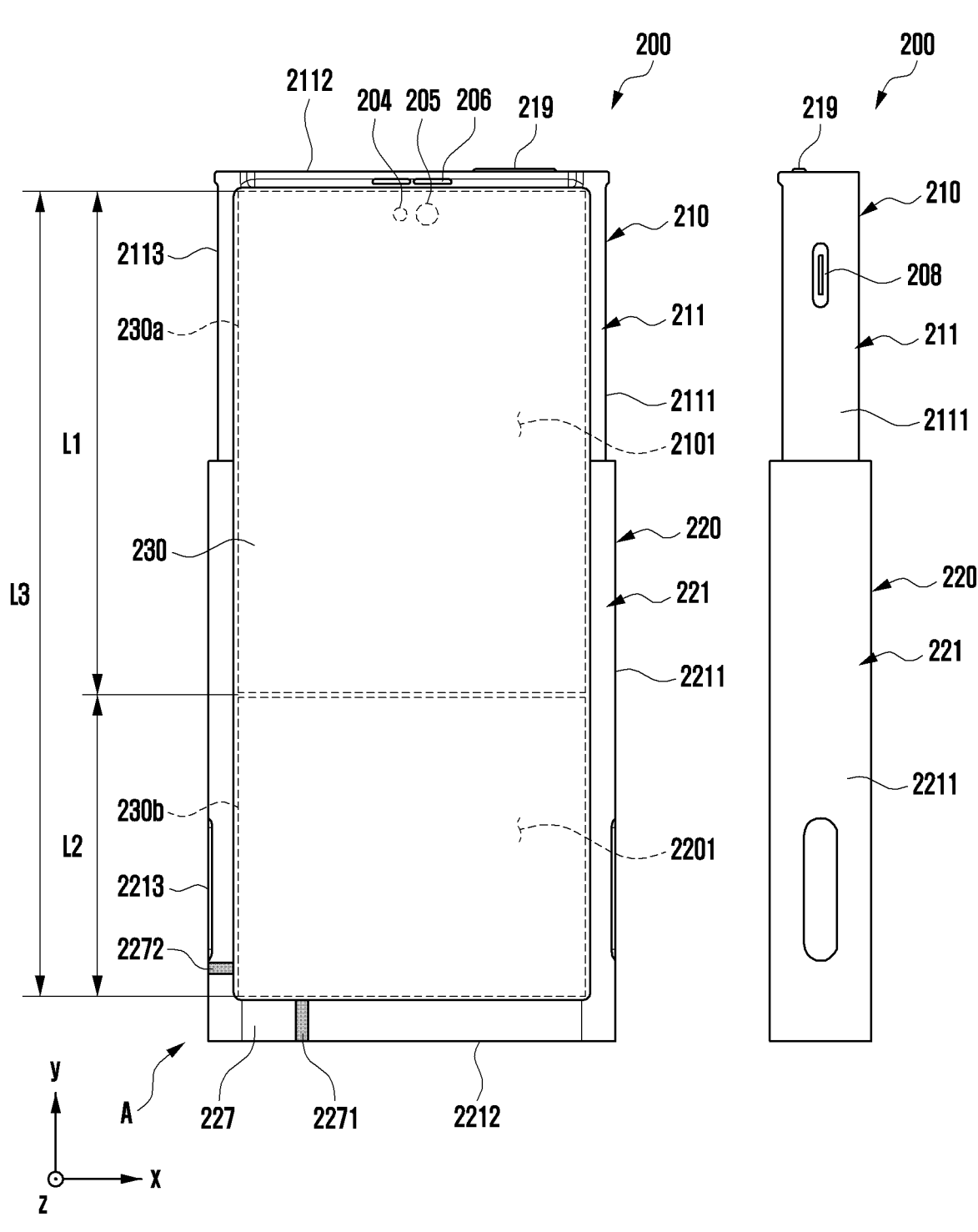
FIGS. 3A and 3B are views illustrating the front surface and the rear surface in a slide-out state of an electronic device according to various embodiments of the disclosure.
Figure 3B:
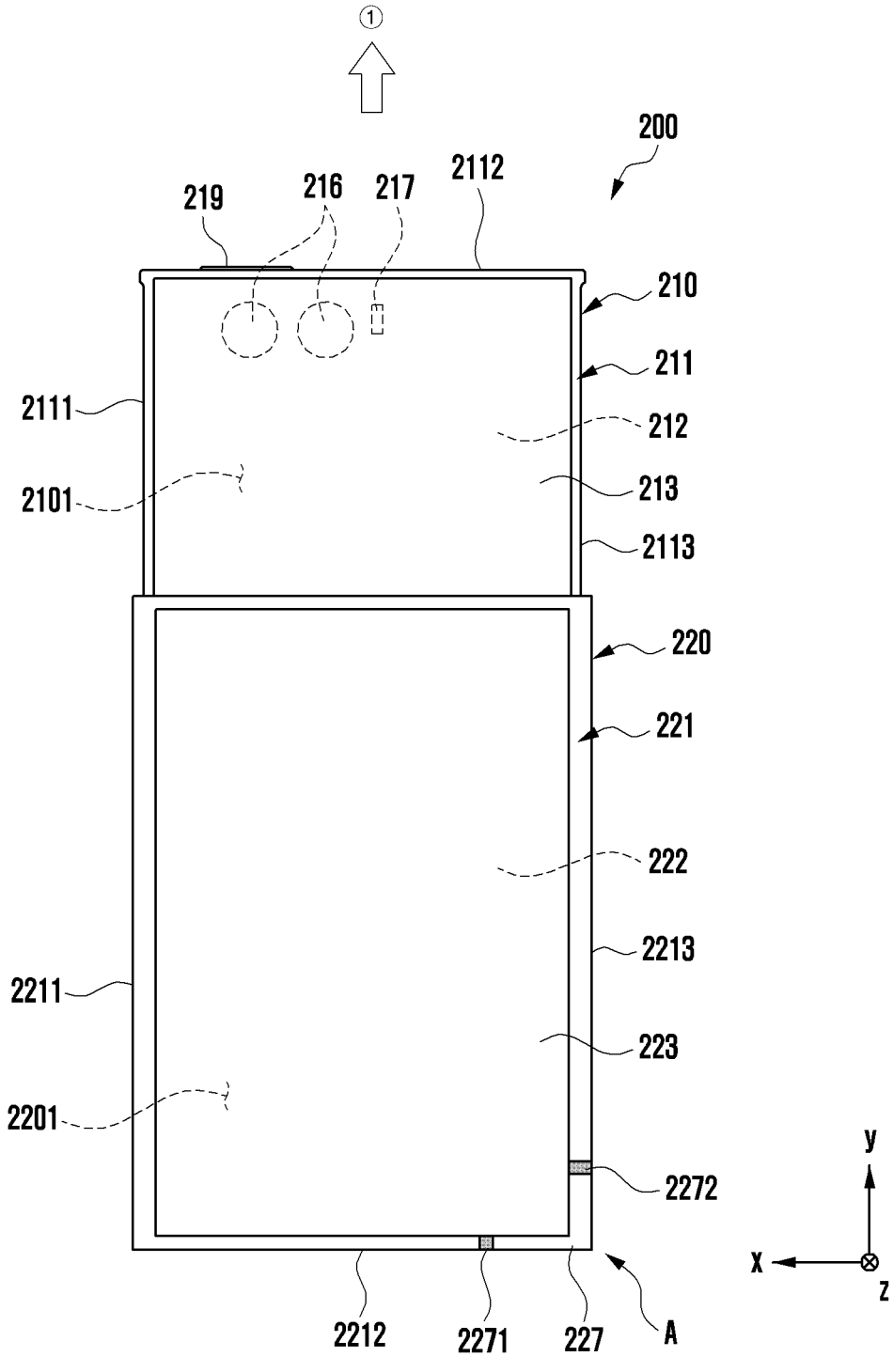

FIGS. 3A and 3B are views illustrating the front surface and the rear surface in a slide-out state of an electronic device according to various embodiments of the disclosure.

An electronic device 200 in FIGS. 2A, 2B, 3A, and 3B may be at least partially similar to the electronic device 101 in FIG. 1, or may further include another embodiment of the electronic device 101.

Referring to FIGS. 2A, 2B, 3A, and 3B, the electronic device 200 may include a first housing 210 (e.g., a first housing structure, a moving part, and/or a slide housing), a second housing 220 (e.g., a second housing structure, a fixation part, and/or a base housing) coupled to the first housing 210 so as to be slidable in a designated direction (e.g., the direction ① or the direction ②) (e.g., the y-axis direction), and a flexible display 230 (e.g., an expandable display or a stretchable display) disposed to be supported through at least a part of the first housing 210 and the second housing 220. The electronic device 200 may be configured such that the first housing 210 is disposed to be withdrawn in a first direction (the direction ①) (slide-out) or to be introduced in a second direction (the direction ②) opposite to the first direction (the direction ①) (slide-in), based on the second housing 220 gripped by a user. At least a part of the first housing 210 including a first space 2101 may be accommodated in a second space 2201 of the second housing 220, and thus may be changed to a slide-in state. The electronic device 200 may include a bendable member (or a bendable support member) (e.g., the bendable member 240 in FIG. 4) (e.g., a multi-joint hinge module or a multi-bar assembly) which forms at least partially the same plane as at least a part of the first housing 210 in a slide-out state, and is at least partially accommodated in the second space 2201 of the second housing 220 in a slide-in state. In a slide-in state, at least a part of the flexible display 230 may be accommodated in the inner space 2201 of the second housing 220 while being supported by a bendable member (e.g., the bendable member 240 in FIG. 4), and thus be disposed so as not to be seen from the outside. In a slide-out state, at least a part of the flexible display 230 may be disposed to be visible from the outside while being supported by a bendable member (e.g., the bendable member 240 in FIG. 4) which forms at least partially the same plane as the first housing 210.

The electronic device 200 may include the first housing 210 including a first lateral member 211 and the second housing 220 including a second lateral member 221. The first lateral member 211 may include a first side surface 2111 having a first length along the first direction (e.g., the y-axis direction), a second side surface 2112 extending to have a second length shorter than the first length along a direction (e.g., the x-axis direction) substantially perpendicular to the first side surface 2111, and a third side surface 2113 extending substantially parallel to the first side surface 2111 from the second side surface 2112 and having the first length. The first lateral member 211 may be at least partially formed of a conductive material (e.g., metal). According to an embodiment of the disclosure, the first lateral member 211 may be formed by combining a conductive material and a non-conductive material (e.g., polymer). The first housing 210 may include a first support member 212 extending from at least a part of the first lateral member 211 to at least a part of the first space 2101. The first support member 212 may be formed integrally with the first lateral member 211. The first support member 212 may be configured to be separate from the first lateral member 211, and may also be structurally coupled to the first lateral member 211.

The second lateral member 221 may include a fourth side surface 2211 at least partially corresponding to the first side surface 2111 and having a third length, a fifth side surface 2212 extending in a direction substantially parallel to the second side surface 2112 from the fourth side surface 2211 and having a fourth length shorter than the third length, and a sixth side surface 2213 extending to correspond to the third side surface 2113 from the fifth side surface 2212 and having the third length. The second lateral member 221 may also be at least partially formed of a conductive material (e.g., metal). The second lateral member 221 may be formed by combining a conductive material and a non-conductive material (e.g., polymer). At least a part of the second lateral member 221 may include a second support member 222 extending to at least a part of the second space 2201 of the second housing 220. The second support member 222 may be formed integrally with the second lateral member 221. The second support member 222 may be configured to be separate from the second lateral member 221, and may also be structurally coupled to the second lateral member 221.

The first side surface 2111 and the fourth side surface 2211 may be slidably coupled to each other. The third side surface 2113 and the sixth side surface 2213 may be slidably coupled to each other. In a slide-in state, the first side surface 2111 may overlap the fourth side surface 2211, and thus be disposed so as not to be substantially seen from the outside. In a slide-in state, the third side surface 2113 may overlap the sixth side surface 2213, and thus be disposed so as not to be substantially seen from the outside. At least a part of the first side surface 2111 and the third side surface 2113 may also be disposed to be at least partially visible from the outside in a slide-in state. In a slide-in state, the first support member 212 may overlap the second support member 222, and thus be disposed so as not to be substantially seen from the outside. In a slide-in state, a part of the first support member 212 may overlap the second support member 222 and thus be disposed so as not be seen from the outside, and a part of the rest of the first support member 212 may also be disposed to be visible from the outside.

The electronic device 200 may include a first rear cover 213 coupled to the first housing 210, on the rear surface thereof. The first rear cover 213 may be disposed through at least a part of the first support member 212. The first rear cover 213 may also be formed integrally with the first lateral member 211. According to an embodiment of the disclosure, the first rear cover 213 may be formed of polymer, coated or colored glass, ceramic, metal (e.g., aluminum, stainless steel (STS), or magnesium), or a combination of at least two of the above-materials. The first rear cover 213 may also extend to at least a part of the first lateral member 211. At least a part of the first support member 212 may also be replaced with the first rear cover 213.

The electronic device 200 may include a second rear cover 223 coupled to the second housing 220, on the rear surface thereof. The second rear cover 223 may be disposed through at least a part of the second support member 222. The second rear cover 223 may also be formed integrally with the second lateral member 221. According to an embodiment of the disclosure, the second rear cover 223 may be formed of polymer, coated or colored glass, ceramic, metal (e.g., aluminum, stainless steel (STS), or magnesium), or a combination of at least two of the above-materials. The second rear cover 223 may also extend to at least a part of the second lateral member 221. In some embodiments, at least a part of the second support member 222 may also be replaced with the second rear cover 223.

The electronic device 200 may include the flexible display 230 disposed to be supported by at least a part of the first housing 210 and the second housing 220. The flexible display 230 may include a first portion 230a (e.g., a flat-surface part) always visible from the outside, and a second portion 230b (e.g., a bendable part) which extends from the first portion 230a and is at least partially accommodated in the second space 2201 of the second housing 220 such that at least a portion thereof is not seen from the outside in a slide-in state. The first portion 230a may be disposed to be supported by the first housing 210, and the second portion 230b may be disposed to be supported at least partially by a bendable member (e.g., the bendable member 240 in FIG. 4). In a state where the first housing 210 is withdrawn along the first direction (the direction ①), the second portion 230b of the flexible display 230 may extend from the first portion 230a while being supported by a bendable member (e.g., the bendable member 240 in FIG. 4), may form substantially the same plane as the first portion 230a, and may be disposed to be visible from the outside. In a state where the first housing 210 is introduced along the second direction (the direction ②), the second portion 230b of the flexible display 230 may be accommodated in the second space 2201 of the second housing 220 and may be disposed so as not to be seen from the outside. Accordingly, the electronic device 200 may induce the first housing 210 to move in a sliding manner along a designated direction (e.g., the y-axis direction) from the second housing 220 and thus the display area of the flexible display 230 is variable.

The flexible display 230 may have a variable length in the first direction (the direction ①) according to a sliding movement of the first housing 210 moved relative to the second housing 220. For example, in a slide-in state, the flexible display 230 may have a first display area (e.g., a region corresponding to the first portion 230a) corresponding to a first length L1. Tn a slide-out state, the flexible display 230 may be expanded to have a third display area (e.g., a region including a first portion 230a and a second portion 230b) which corresponds to a third length L3 longer than the first length L1 and is larger than the first display area, according to a sliding movement of the first housing 210 which has been additionally moved by a second length L2, based on the second housing 220.

The electronic device 200 may include at least one of an input module (e.g., the microphone 203-1), a sound output module (e.g., the call receiver 206 or the speaker 207), sensor modules 204 and 217, a camera module (e.g., the first camera module 205 or the second camera module 216), a connector port 208, a key input device 219, or an indicator (not shown) which are arranged in the first space 2101 of the first housing 210. The electronic device 200 may include another input device (e.g., the microphone 203) disposed in the second housing. According to an embodiment of the disclosure, the electronic device 200 may also be configured such that at least one of the above-described elements is omitted or other elements are additionally included. At least one of the above-described elements may also be disposed in the second space 2201 of the second housing 220.

The input device may include a microphone 203-1. An input device (e.g., the microphone 203-1) may also include multiple microphones arranged to be able to detect a direction of sound. For example, a sound output device may include a call receiver 206 and a speaker 207. The speaker 207 may also correspond to the outside through at least one speaker hole formed through the first housing 210 at a position (e.g., the second side surface 2112) which is always exposed to the outside regardless of slide-in/slide-out states. In a slide-out state, the connector port 208 may also correspond to the outside through a connector port hole formed through the first housing 210. In a slide-in state, the connector port 208 may also correspond to the outside through an opening formed through the second housing and formed to correspond to a connector port hole. The call receiver 206 may also include a speaker (e.g., a piezo speaker) which operates while a separate hole is excluded.

The sensor modules 204 and 217 may generate an electrical signal or a data value corresponding to an internal operation state of the electronic device 200 or an external environmental state. For example, the sensor modules 204 and 217 may include a first sensor module 204 (e.g., a proximity sensor or an illuminance sensor) disposed on the front surface of the electronic device 200, and/or a second sensor module 217 (e.g., a heart rate monitoring (HRM) sensor) disposed on the rear surface of the electronic device 200. The first sensor module 204 may be disposed under the flexible display 230, on the front surface of the electronic device 200. The first sensor module 204 and/or the second sensor module 217 may include at least one of a proximity sensor, an illuminance sensor 204, a time of flight (TOF) sensor, an ultrasonic sensor, a fingerprint recognition sensor, a gesture sensor, a gyro sensor, a barometric pressure sensor, a magnetic sensor, an acceleration sensor, a grip sensor, a color sensor, an infrared (IR) sensor, a biometric sensor, a temperature sensor, or a humidity sensor.

The camera module may include a first camera module 205 disposed on the front surface of the electronic device 200, and a second camera module 216 disposed on the rear surface of the electronic device 200. The electronic device 200 may also include a flash (not shown) positioned near the second camera module 216. The camera modules 205 and 216 each may include one lens or multiple lenses, an image sensor, and/or an image signal processor. The first camera device 205 may be disposed under the flexible display 230, and may also be configured to photograph a subject through a part of an active region (e.g., a display region) of the flexible display 230.

The first camera module 205 among the camera modules and a sensor module 204 of the sensor modules 204 and 217 may be arranged to detect an external environment through the flexible display 230. For example, the first camera module 205 or the sensor module 204 may be disposed to be in contact with an external environment in the first space 2201 of the first housing 210 through a transmissive region or a perforated opening formed in the flexible display 230. A region facing the first camera module 205 of the flexible display 230 may also be formed as a transmissive region having a designated transmissivity as a part of the display region for displaying content. According to one embodiment, the transmissive region may be formed to have a transmissivity in the range of about 5% to about 20%. The transmissive region may include a region overlapping an effective region (e.g., a view angle region) of the first camera module 205, through which light for generating an image imaged by an image sensor passes. For example, the transmissive region of the flexible display 230 may include a region having a lower pixel arrangement density and/or a lower wire density than the perimeter thereof. For example, the transmissive region may replace the above-described opening. For example, a camera module 205 may include an under-display camera (UDC). A sensor module 204 may also be disposed to perform functions thereof while not being visually exposed through the flexible display 230 in an inner space of the electronic device 200.

The electronic device 200 may include at least one antenna (e.g., the antenna 214b in FIGS. 10A to 10E) electrically connected to a wireless communication circuit (e.g., the wireless communication module 192 in FIG. 1) disposed in the second housing 220. The electronic device 200 may also include a bezel antenna A disposed through the second lateral member 221 of the second housing 220, which has conductivity. For example, the bezel antenna A may include a conductive portion 227 disposed on at least a part of the fifth side surface 2212 and the sixth side surface 2213 of the second lateral member 221 and electrically segmented through at least one segment part 2271 or 2272 formed of a non-conductive material (e.g., polymer). According to an embodiment of the disclosure, a wireless communication circuit (e.g., the wireless communication module 192 in FIG. 1) may be configured to transmit or receive a wireless signal in at least one frequency band (e.g., about 800 MHz to 6000 MHz) (e.g., legacy band) designated through the conductive portion 227. The electronic device 200 may include a side cover 2212a disposed on the fifth side surface 2212 in order to cover at least a part of the at least one segment part 2271. The bezel antenna A may also be disposed on at least one side surface of the second side surface 2112, the fourth side surface 2211, the fifth side surface 2212, and the sixth side surface 2213. The electronic device 200 may also further include at least one antenna module (e.g., a 5G antenna module or an antenna structure) which is disposed in an inner space (e.g., the first space 2101 or the second space 2201) thereof and disposed to transmit or receive a wireless signal in a frequency band in the range of about 3 GHz to 100 GHz through another wireless communication circuit (e.g., the wireless communication module 192 in FIG. 1).

Slide-in/slide-out operations of the electronic device 200 may be performed under a set condition (e.g., a set moving direction and/or a set moving distance) by the driving of a driving module (e.g., a driving motor). For example, slide-in/slide-out operations of the electronic device 200 may be performed through a gearing operation between a driving motor (e.g., the driving motor 260 in FIG. 4) including a pinion gear 261 disposed in the first space 2101 of the first housing 210 and a rack gear (e.g., the rack gear 2251 in FIG. 4) disposed in the second space 2201 of the second housing 220 and engaged with the pinion gear 261. For example, a processor (e.g., the processor 120 in FIG. 1) of the electronic device 200 may be configured to drive a driving motor (e.g., the driving motor 260 in FIG. 4) disposed inside the electronic device 200 in case that the electronic device is switched from a slide-in state to a slide-out state or in case of detecting a triggering operation in order for the electronic device to be switched from a slide-out state to a slide-in state. The triggering operation may include selection (touch) of an object displayed on the flexible display 230, execution of a designated function or application, or a manipulation of a physical button (e.g., a key button) included in the electronic device 200.

Figure 4:
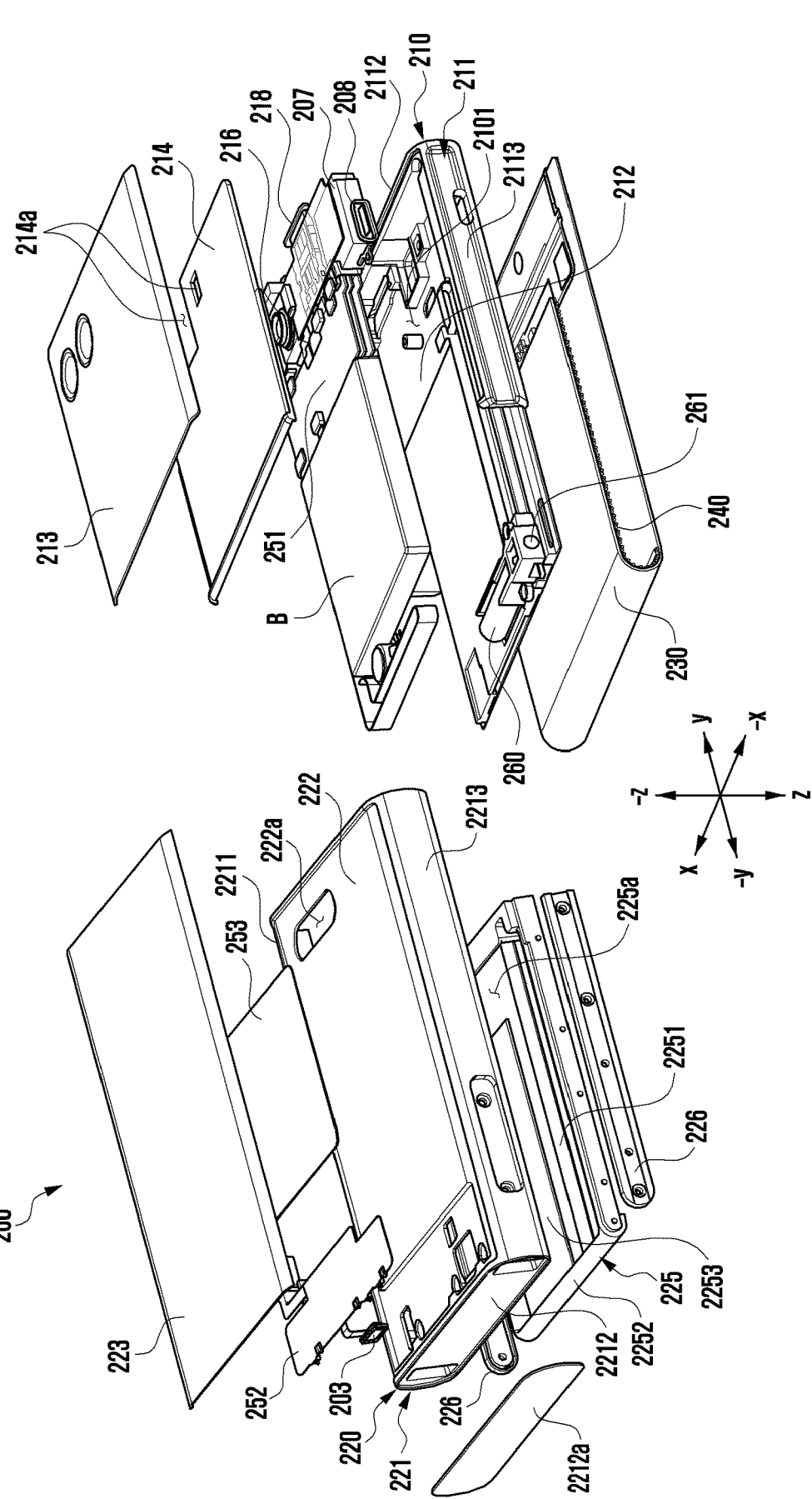
FIG. 4 is an exploded perspective view of an electronic device according to an embodiment of the disclosure.

FIG. 4 is an exploded perspective view of an electronic device according to an embodiment of the disclosure.

In describing an electronic device 200 in FIG. 4, elements substantially the same as those of the electronic device 200 in FIGS. 2A, 2B, 3A, and 3B are given identical reference numerals, and detailed descriptions thereof may be omitted.

Referring to FIG. 4, an electronic device 200 may include a first housing 210 including a first space 2101, a second housing 220 which is slidably coupled to the first housing 210 and includes a second space (e.g., the second space 2201 in FIG. 3A), a bendable member 240 which is at least partially rotatably disposed in the second space 2201, a flexible display 230 disposed to be supported by at least a part of the bendable member 240 and the first housing 210, and a driving module for driving the first housing 210 in a direction (e.g., the −y-axis direction) in which the first housing slides into the second housing 220 and/or a direction (e.g., the y-axis direction) in which the first housing 210 slides out of the second housing 220. According to one embodiment, the driving module may include a driving motor 260 which is disposed in the first space 2101 and includes a pinion gear 261, and a rack gear 2251 disposed to mesh with the pinion gear 261, in the second space 2201. According to one embodiment, the driving module may further include a deceleration module engaged with the driving motor 260 so as to reduce the rotational speed and increase the driving force thereof. According to one embodiment, the driving motor 260 may be disposed to be supported through at least a part of a first support member 212, in the first space 2101 of the first housing 210. According to one embodiment, the driving motor 260 may be fixed to the end (e.g., the edge) of the first support member 212 in a slide-in direction (e.g., the −y-axis direction) in the first space 2101.

The electronic device 200 may include multiple electronic components arranged in the first space 2101. The multiple electronic components may include a first substrate 251 (e.g., a main substrate), a camera module 216 disposed around the first substrate 251, a socket module 218 (e.g., a SIM tray), a speaker 207, a connector port 208, and a battery B. The multiple electronic components may be arranged around the first substrate 251 together with the driving motor 260 in the first space 2101 of the first housing 210 so as to enable efficient electrical connection thereof.

The electronic device 200 may include a rear bracket 214 disposed to cover at least a part of the multiple electronic components, between the first support member 212 and a first rear cover 213 of the first housing 210. The rear bracket 214 may be structurally coupled to at least a part of the first support member 212. According to an embodiment of the disclosure, the rear bracket 214 may also be omitted. The rear bracket 214 may be disposed to cover the multiple electronic components and to support the first rear cover 213. The rear bracket 214 may include a notch region 214a or an opening 214a (e.g., a through-hole) formed in a region corresponding to a camera module 216 and/or a sensor module (e.g., the sensor module 217 in FIG. 3B). The camera module 216 and/or the sensor module 217 may be disposed to detect an external environment through the notch region 214a or the opening 214a. A region of the first rear cover 213, which corresponds at least to the camera module 216 and/or the sensor module 217, may be transparently processed. According to an embodiment of the disclosure, the camera module 216 and/or sensor module 217 may also be configured to operate only in case that the electronic device 200 is in a slide-out state.

The electronic device 200 may include a plate-type support bracket 225 (e.g., a display support bar (DSB)) disposed in the second space 2201 of the second housing 220 and slidably coupled to at least a part of the first support member 212. The support bracket 225 may include an opening 225a having a designated size. The support bracket 225 may include a support part 2252 disposed at one end thereof and formed to have a curved outer surface in order to support the rear surface of the bendable member 240 which is flexed during a sliding operation thereof. The support bracket 225 may also include a support plate 2253 formed to extend from at least a part of the support part 2252 to at least a part of the opening 225a and thus to support the rear surface of the bendable member 240 in a slide-out state. The support bracket 225 may include a rack gear 2251 which crosses the opening 225a and is fixed to have a length along a direction parallel to the sliding direction thereof. The rack gear 2251 may also be formed integrally with the support bracket 225. The electronic device 200 may include a pair of guide rails 226 arranged on opposite side surfaces of the support bracket 225 in order to guide opposite ends of the bendable member 240 in the sliding direction thereof.

The second support member 222 of the second housing 220 may include openings 222a (e.g., a through hole) disposed at a region corresponding to the camera module 216 and/or the sensor module 217 disposed in the first housing 210, in case that the electronic device 200 is in a slide-in state. The camera module 216 and/or the sensor module 217 may detect an external environment through the opening 222a formed through the second housing 220 in case that the electronic device 200 is in a slide-in state. In this case, a region of a second rear cover 223, which corresponds at least to the camera module 216 and/or the sensor module 217, may be transparently processed.

The electronic device 200 may include a second substrate 252 and an antenna member 253 which are arranged in a space between the second support member 222 and the second rear cover 223 of the second housing 220. The second substrate 252 and the antenna member 253 may be electrically connected to the first substrate 251 through at least one electrical connection member (e.g., a flexible printed circuit board (FPCB) or a flat ribbon cable (FRC), or a flexible radio frequency (RF) cable). In some embodiments, the antenna member 253 may be electrically connected to the second substrate 252, and thus may also be electrically connected to the first substrate 251 through the second substrate 252.

Figure 5A:
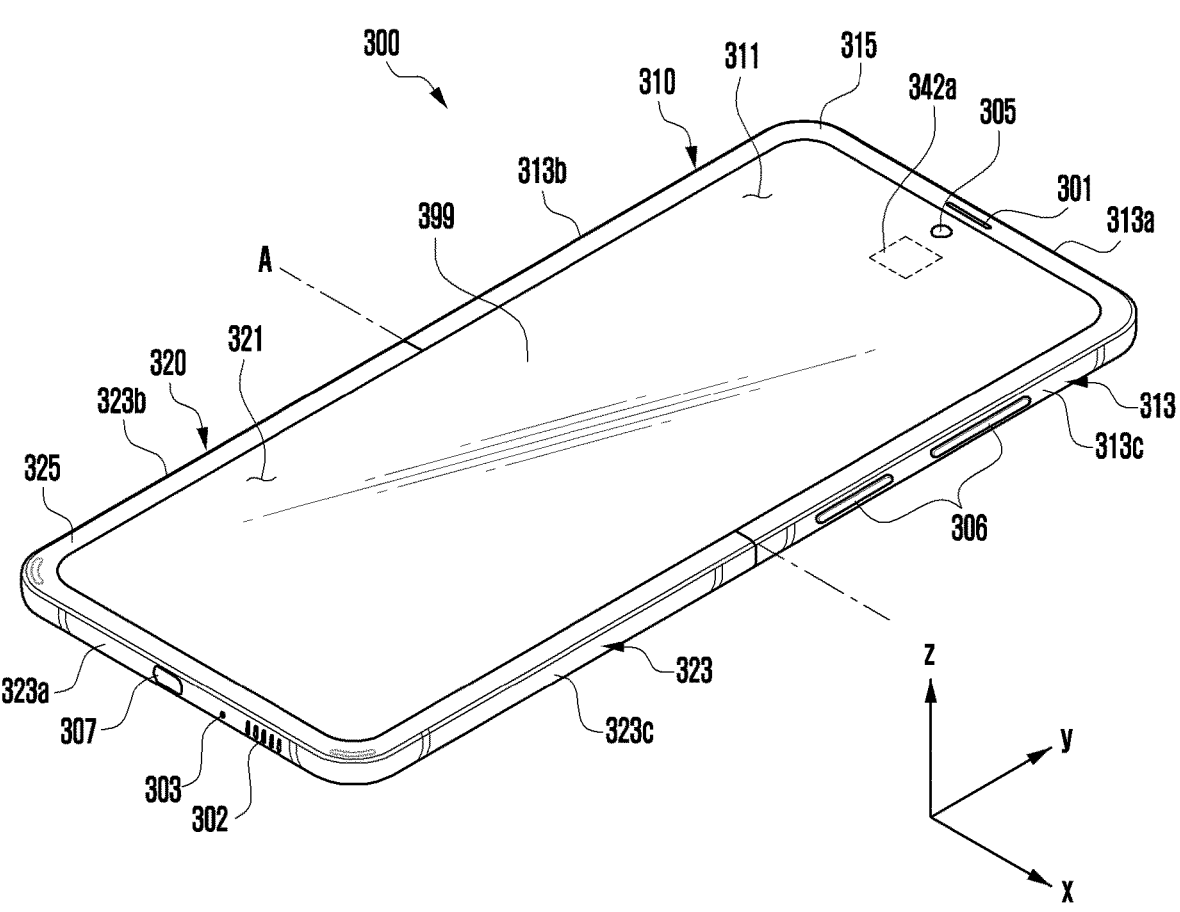
FIGS. 5A, 5B, 5C, 5D, 5E, and 5F illustrate a portable electronic device having an in-folding type housing structure according to various embodiments of the disclosure.
Figure 5B:
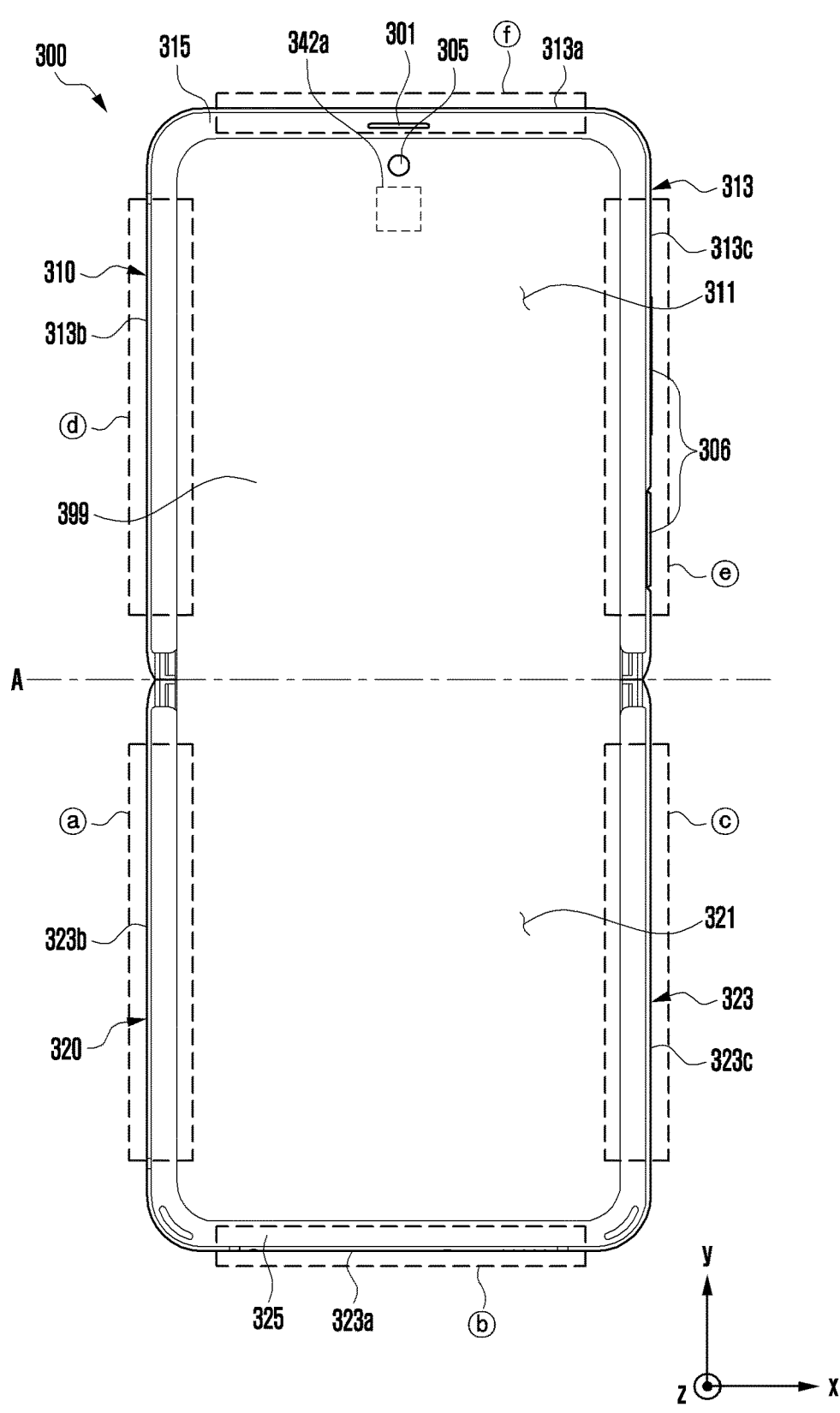
Figure 5C:
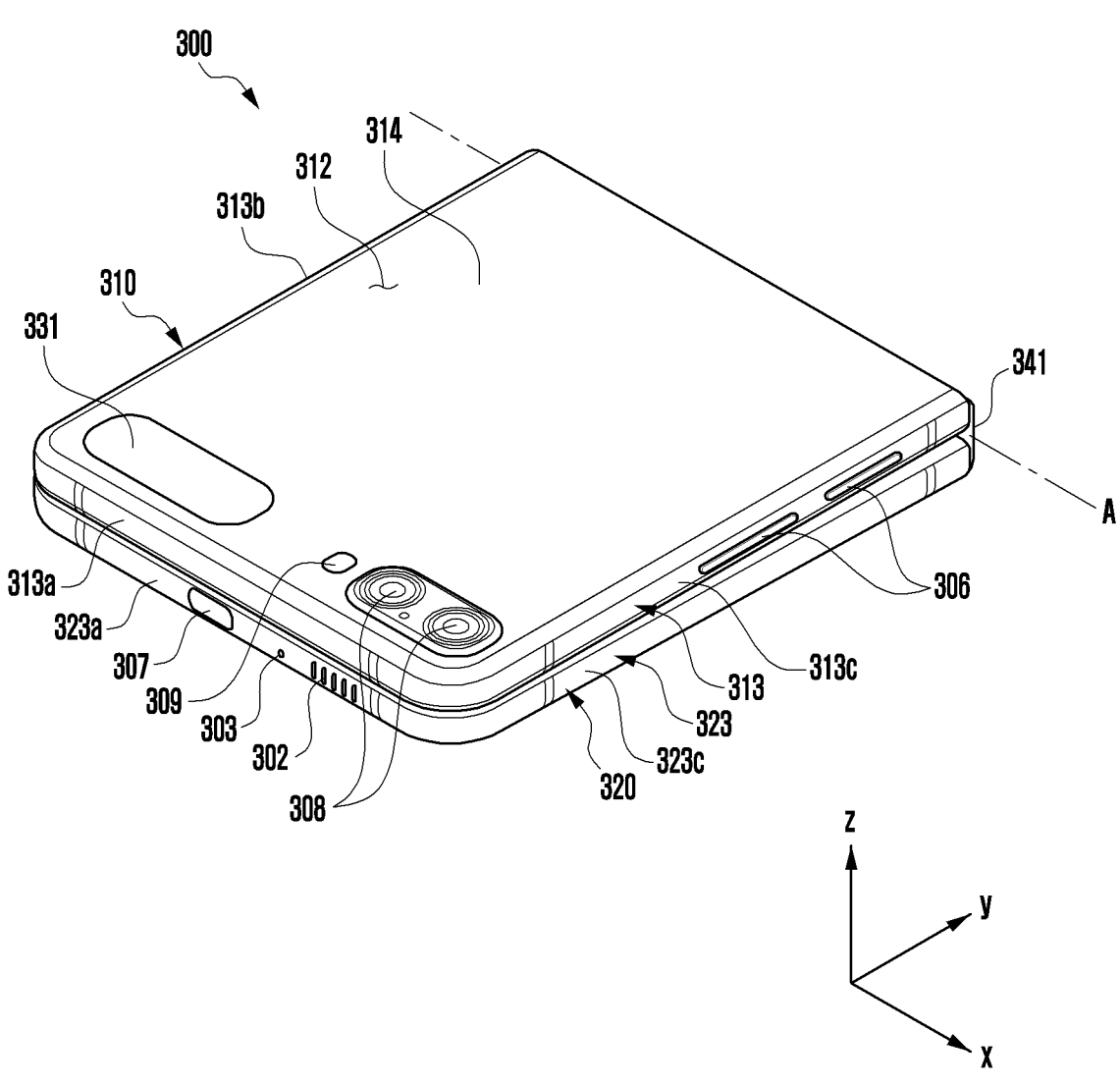
Figure 5D:
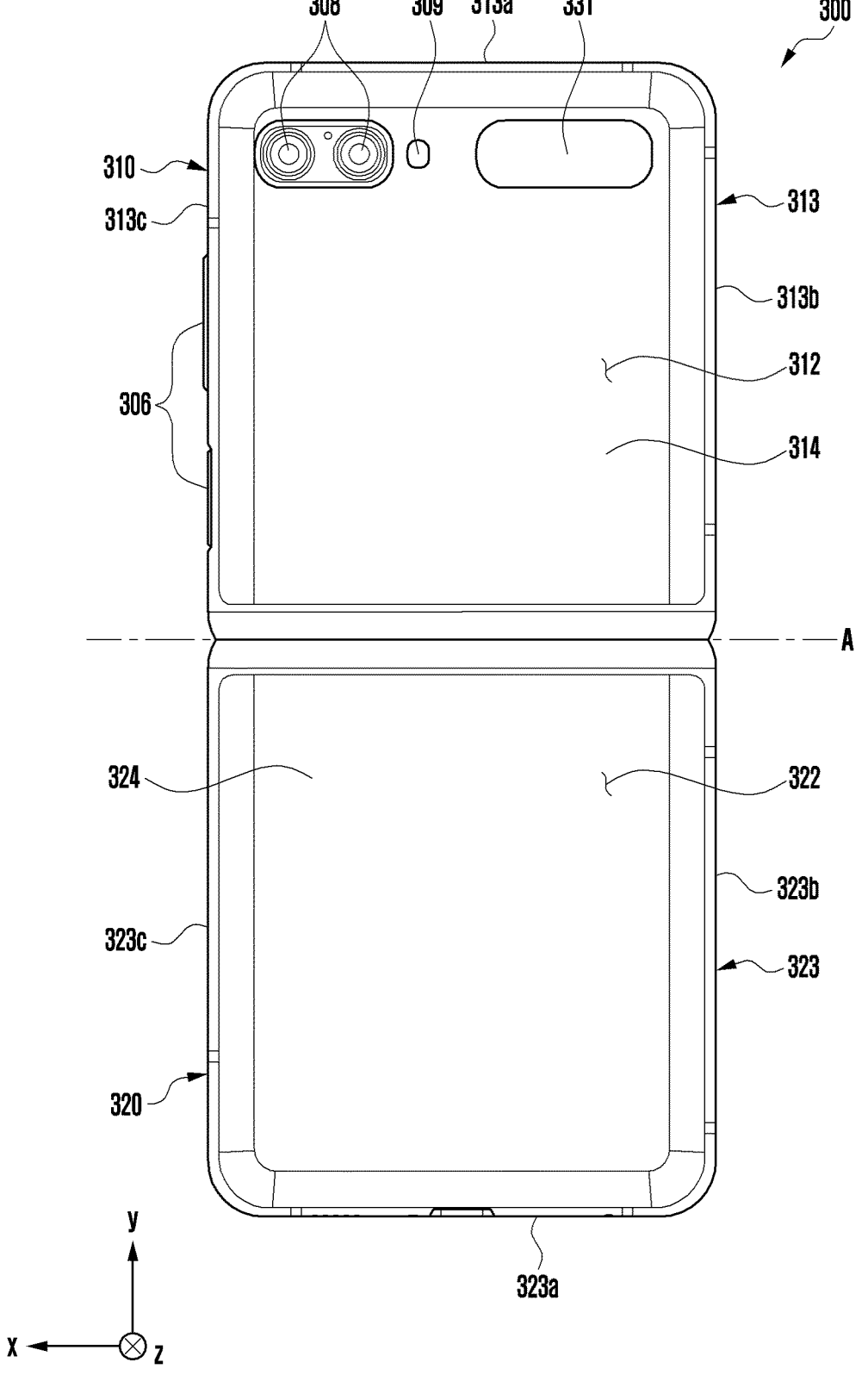
Figure 5E:
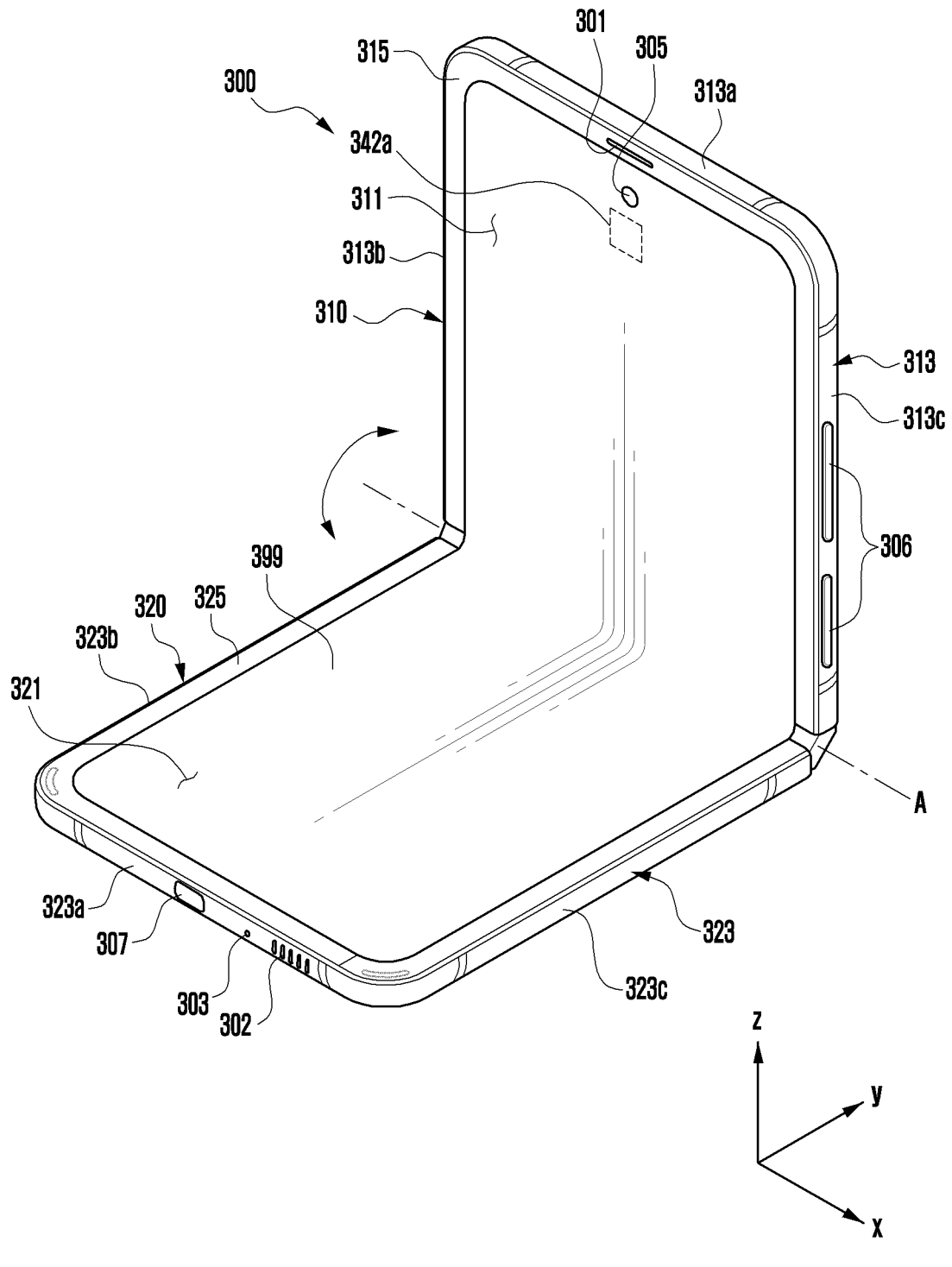
Figure 5F:
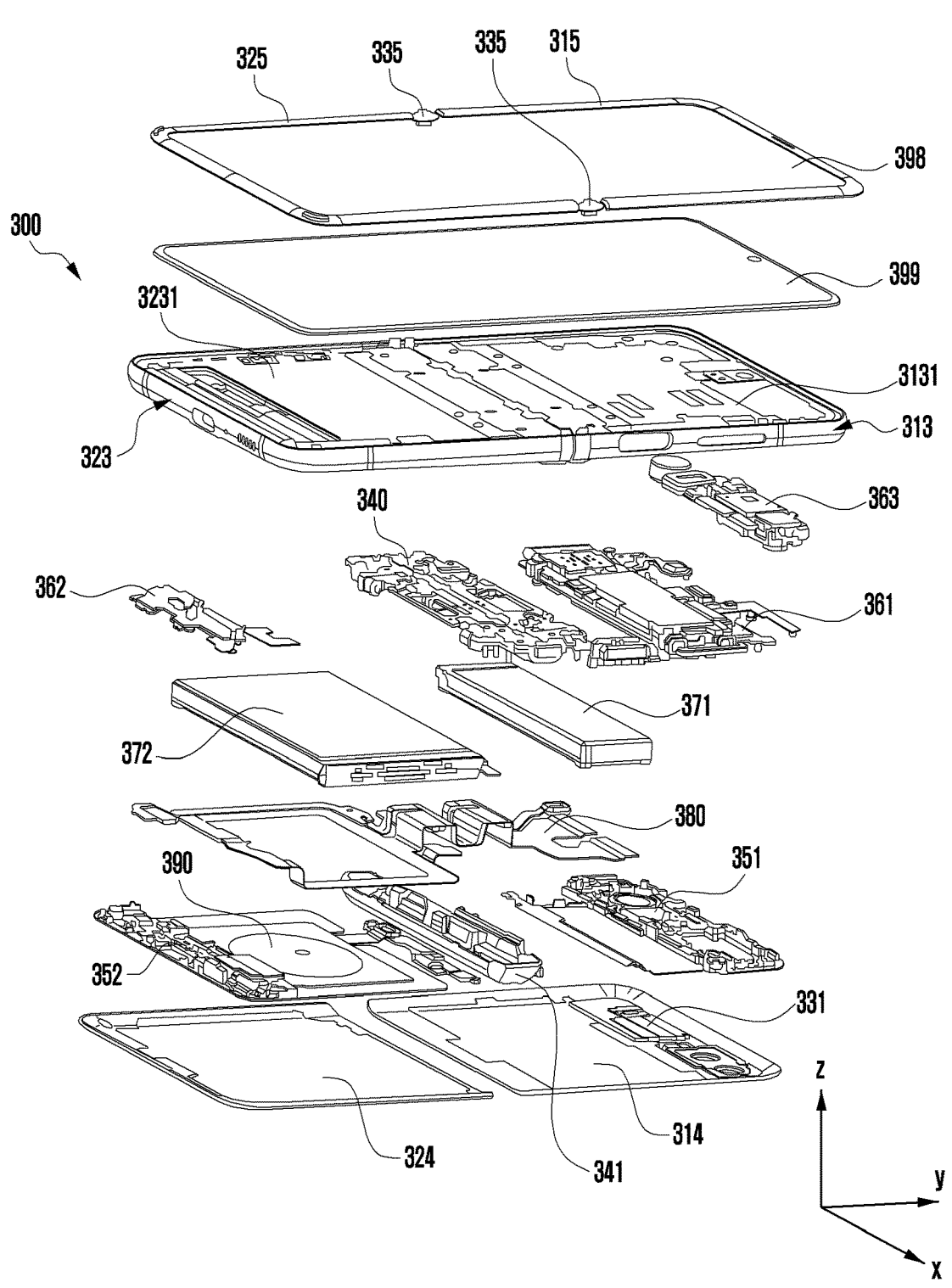

FIGS. 5A to 5F illustrate a portable electronic device 300 having an in-folding type housing structure according to various embodiments of the disclosure. FIGS. 5A and 5B illustrate the front surface in a state where a foldable portable electronic device (hereinafter, shortly referred to as an electronic device) according to various embodiments is unflexed (unfolded, flat, or open), FIG. 5C illustrates the rear surface in a state where the electronic device is flexed (folded or closed), FIG. 5D illustrates the rear surface in an unflexed state thereof, FIG. 5E illustrates the front surface in a partially flexed (folded) state (in other words, a partially unflexed state or an intermediate state (a free stop state) between a fully flexed state and a fully unflexed state), and FIG. 5F is an exploded perspective view of the electronic device.

Referring to FIGS. 5A to 5F, a portable electronic device 300 (e.g., the electronic device 101 in FIG. 1) may include a first housing 310, a second housing 320, a hinge assembly 340 configured to connect the first housing 310 and the second housing 320 such that the second housing 320 is rotatable with respect to the first housing 310, a flexible or foldable display 399 disposed in a space formed by the foldable housings 310 and 320, and a sensor module (e.g., the sensor module 176 in FIG. 1).

The display 399 may be disposed to cross the hinge assembly 340 from the first housing 310 to the second housing 320. The display 399, based on a folding axis A, may be divided into a first display region 311 disposed in the inner space of the first housing 310 and a second display region 321 disposed in the inner space of the second housing 320. The sensor module (e.g., an illuminance sensor) may be disposed below a sensor region (or a light-transmitting region) 342a of the first display region 311 when seen from the front surface thereof. The position and/or size of the sensor region 342a in the first display region 311 may be determined by the position and/or size of an illuminance sensor disposed below the sensor region 342a. For example, the size (e.g., the diameter) of the sensor region 342a may be determined based on a field of view (FOV) of an illuminance sensor. The sensor region 342a may be configured to have a lower pixel density and/or a lower wire density than the perimeter thereof in order to improve light transmissivity. In some embodiments, the display 399 may include a protective layer 398 which includes a transparent material and protects a panel layer from external foreign substances and impacts.

The hinge assembly 340 may be implemented in an in-folding type in which the two display regions 311 and 321 face each other in case that the portable electronic device 300 is switched from an unflexed state (e.g., the state in FIG. 5A) into a flexed state (e.g., the state in FIG. 5C). For example, in case that the electronic device 300 is an unflexed state, the two display regions 311 and 321 may be oriented in a substantially identical direction. According to switching from an unflexed state into a flexed state, the two display regions 311 and 321 may rotate in directions facing each other. The hinge assembly 340 may be configured to have a resistance force against the rotation of the foldable housings 310 and 320. In case that an external force exceeding the resistance force is applied to the foldable housings 310 and 320, the foldable housings 310 and 320 may rotate.

A state of the electronic device 300 may be defined based on an angle formed between the two display regions 311 and 321. For example, in case that the angle between the two display regions 311 and 321 is about 180 degrees, the state of the electronic device 300 may be defined as an unflexed (unfolded, flat, or open) state. In case that the angle between the two display regions 311 and 321 is an angle between about 0 and 10 degrees, the state of the portable electronic device 300 may be defined as a flexed (folded or closed) state. In case that the two display regions 311 and 321 form an angle (e.g., an angle between about 10 to 179 degrees) which is greater than the angle of a flexed state and smaller than the angle of an unflexed state, as illustrated in FIG. 5E, the state of the portable electronic device 300 may be defined as an intermediate state (in other words, a partially flexed (folded) state or a fully unflexed state).

Based on a state of the portable electronic device 300, an active region, in which visual information (e.g., a text, an image, or an icon) is displayed on the display 399, may be determined. For example, in case that the electronic device 300 is in an intermediate state, an active region may be determined as the first display region 311 or the second display region 321. A region among the first display region 311 and the second display region 321, which has a relatively smaller movement, may be determined as an active region. For example, in a state where a user grips a housing of the electronic device 300 with one hand, in case that the user opens the other housing with a finger (e.g., a thumb) of the same hand or with the other hand, the electronic device 300 may be switched from a flexed state into an intermediate state, and thus a display region of the gripped housing (i.e., the housing having a relatively small movement) may be determined as an active region of the electronic device 300. In case that the portable electronic device 300 is in an unflexed state, the whole region (e.g., both the first display region 311 and the second display region 321) of the display 399 may be determined as an active region.

According to various embodiments, in an unflexed state, the first housing 310 may include a first surface (a first display region) 311 oriented in a first direction (e.g., the front surface direction) (the z-axis direction), and a second surface 312 oriented in a second direction (e.g., the rear surface direction) (the −z-axis direction) opposite to the first surface 311. In an unflexed state, the second housing 320 may include a third surface (a second display region) 321 oriented in the first direction (the z-axis direction), and a fourth surface 322 oriented in the second direction (the −z-axis direction). The electronic device 300 may operate in a manner in which the first surface 311 of the first housing 310 and the third surface 321 of the second housing 320 are oriented in the same first direction (e.g., the z-axis direction) in an unflexed state, and the first surface 311 and the third surface 321 face each other in a flexed state. The electronic device 300 may operate such that the second surface 312 of the first housing 310 and the fourth surface 322 of the second housing 320 are oriented in the same second direction (e.g., the −z-axis direction) in an unflexed state, and the second surface 312 and the fourth surface 322 are oriented in directions opposite to each other in a flexed state.

The first housing 310 may include a first side frame 313 which at least partially forms the exterior of the electronic device 300, and a first rear cover 314 which is coupled to the first side frame 313 and forms at least a part of the second surface 312 of the electronic device 300. The first side frame 313 may include a first side surface 313a, a second side surface 313b extending from one end of the first side surface 313b, and a third side surface 313c extending from the other end of the first side surface 313a. The first side frame 313 may be formed in a long rectangular (e.g., a square or a rectangular) shape by the first side surface 313a, the second side surface 313b, and the third side surface 313c.

A part of the first side frame 313 may be formed with a conductor. For example, referring to FIG. 5B, a part ⓕ of the first side surface 313a, a part ⓓ of the second side surface 313b, and a part ⓔ of the third side surface 313c may be formed of a metal material. The conductor may be electrically connected to a grip sensor (not shown) disposed in the inner space of the first housing 310 to be adjacent thereto. A processor may measure capacitance formed between the conductor and a ground (e.g., a ground of a main printed circuit board) through a grip sensor, and based on the measured capacitance value, may recognize that a dielectric (e.g., a finger, palm, face) closely approaches to (or is in contact with) the first housing 310, and a portion (e.g., the first side surface 313a, the second side surface 313b, and the third side surface 313c) with which a dielectric is in contact in the first housing 310.

The second housing 320 may include a second side frame 323 which at least partially forms the exterior of the electronic device 300, and a second rear cover 324 which is coupled to the second side frame 323 and forms at least a part of the fourth surface 322 of the electronic device 300. The second side frame 323 may include a fourth side surface 323a, a fifth side surface 323b extending from one end of the fourth side surface 323b, and a sixth side surface 323c extending from the other end of the fourth side surface 323a. The second side frame 323 may be formed in a long rectangular shape by the fourth side surface 323a, the fifth side surface 323b, and the sixth side surface 323c.

A part of the second side frame 323 may be formed with a conductor. For example, referring to FIG. 5B, a part ⓑ of the fourth side surface 323a, a part ⓐ of the fifth side surface 323b, and a part ⓒ of the sixth side surface 323c may be formed of a metal material. The conductor may be electrically connected to a grip sensor (not shown) disposed in the inner space of the second housing 320 to be adjacent thereto. A processor may measure capacitance formed between the conductor and a ground (e.g., a ground of a main printed circuit board) through the grip sensor, and based on the measured capacitance value, may recognize that a dielectric closely approaches to (or is in contact with) the second housing 320, and a portion (e.g., the fourth side surface 323a, the fifth side surface 323b, and the sixth surface 323c) with which a dielectric is in contact in the second housing 320.

The pair of housings 310 and 320 may not be limited to the illustrated shape and coupling, and be may implemented by a combination and/or coupling of other shapes or components. For example, the first side frame 313 may be integrally formed with the first rear cover 314, and the second side frame 323 may be integrally formed with the second rear cover 324.

The first rear cover 314 and the second rear cover 324 may be formed of at least one or a combination of at least two of coated or colored glass, ceramic, polymer or metal (e.g., aluminum, stainless steel (STS), or magnesium).

The electronic device 300 may include a first protective cover 315 (e.g., a first protective frame or a first decorative member) coupled along the edge of the first housing 310. The electronic device 300 may include a second protective cover 325 (e.g., a second protective frame or a second decorative member) coupled along the edge of the second housing 320. The first protective cover 315 and the second protective cover 325 may be formed of a metal material or a polymer material.

The electronic device 300 may include a sub-display 331 disposed separately with the display 399. The sub-display 331 may be disposed on the second surface 312 of the first housing to be at least partially exposed therefrom, and thus may display state information of the electronic device 300 in case that the electronic device is in a flexed state. According to an embodiment of the disclosure, the sub-display 331 may be disposed to be visible from the outside through at least a partial region of the first rear cover 314. According to another embodiment of the disclosure, the sub-display 331 may be disposed on the fourth surface 324 of the second housing 320. In this case, the sub-display 331 may be disposed to be visible from the outside through at least a partial region of the second rear cover 324.

The electronic device 300 may include at least one of an input device 303, sound output devices 301 and 302, camera modules 305 and 308, flash 309, a key input device 306, and a connector port 307, and a sensor module (not shown). The sensor module (e.g., the sensor module 176 in FIG. 1) and a camera 305 may be disposed below the display 399 when seen from the front surface thereof.

The electronic device 300 may operate to maintain an intermediate state through the hinge assembly 340. In this case, the electronic device 300 may control the display 399 such that different contents are displayed on a display area corresponding to the first surface 311 and a display area corresponding to the third surface 321.

Referring FIG. 5F, the electronic device 300 may include the first side frame 313, the second side frame 323, and the hinge assembly 340 for rotatably connecting the first side frame 313 and the second side frame 323. The electronic device 300 may include a first support plate 3131 which at least partially extends from the first side frame 313, and a second support plate 3231 which at least partially extends from the second side frame 323. The first support plate 3131 may be formed integrally with the first side frame 313, or may be structurally coupled to the first side frame 313. Similarly, the second support plate 3231 may be integrally formed with the second side frame 323, or may be structurally coupled to the second side frame 323. The electronic device 300 may include the display 399 disposed to be supported by the first support plate 3131 and the second support plate 3231. The electronic device 300 may include the first rear cover 314 which is coupled to the first side frame 313 and provides a first space between the first rear cover and the first support plate 3131, and the second rear cover 324 which is coupled to the second side frame 323 and provides a second space between the second rear cover and the second support plate 3231. The first side frame 313 and the first rear cover 314 may be formed integrally with each other. The second side frame 323 and the second rear cover

324 may be formed integrally with each other. The electronic device 300 may include the first housing 310 provided through the first side frame 313, the first support plate 3131, and the first rear cover 314. The electronic device 300 may include the second housing 320 provided through the second side frame 323, the second support plate 331, and the second rear cover 324.

Although not illustrated, the hinge assembly 340 may include a first arm structure coupled to the first housing 310 (e.g., the first support plate 3231), a second arm structure coupled to the second housing 320 (e.g., the second support plate 3232), and a detent structure which is in physical contact with the first arm structure and the second arm structure such that the first housing 310 and second housing 320 have a resistance force against the rotation thereof. The foldable housings 310 and 320 may have a resistance force against the rotation thereof by a contact force (e.g., the force of pushing the first arm structure and the second arm structure) of the detent structure.

The electronic device 300 may include a first substrate assembly 361 (e.g., a main printed circuit board), a camera assembly 363, a first battery 371, or a first bracket 351 which are arranged in the first space between the first side frame 313 and the first rear cover 314. The camera assembly 363 may include multiple cameras (e.g., the camera modules 305 and 308 in FIGS. 5A and 5C), and may be electrically connected to the first substrate assembly 361. The first bracket 351 may provide a support structure or improved rigidity for supporting the first substrate assembly 361 and/or the camera assembly 363. The electronic device 300 may include a second substrate assembly 362 (e.g., a sub-printed circuit board), an antenna 390 (e.g., a coil member), a second battery 372, or a second bracket 352 which are arranged in the second space between the second side frame 323 and the second rear cover 324. The electronic device 300 may include a wire member 380 (e.g., a flexible printed circuit board (FPCB)) which is disposed to extend up to multiple electronic components (e.g., the second substrate assembly 362, the second battery 372, or the antenna 390) arranged between the second side frame 323 and the second rear cover 324 while crossing the hinge assembly 340 from the first substrate assembly 361, and provides an electric connection.

The electronic device 300 may include a hinge cover 341 which supports the hinge assembly 340, is exposed to the outside in case that the electronic device 300 is in a flexed state, and is disposed not to be seen from the outside by sliding in the first space and the second space in case that the electronic device is in an unflexed state.

The electronic device 300 may include a first protective cover 315 coupled along the edge of the first side frame 313. The electronic device 300 may include a second protective cover 325 coupled along the edge of the second side frame 323. In the display 399, the edge of the first display region 311 may be protected by the first protective cover 315. The edge of the second display region 321 may be protected by the second protective cover 325. A protective cap 335 may be disposed in a region corresponding to the hinge assembly 340 and thus may protect a portion of the display 399 to be flexed.

Figure 6A:
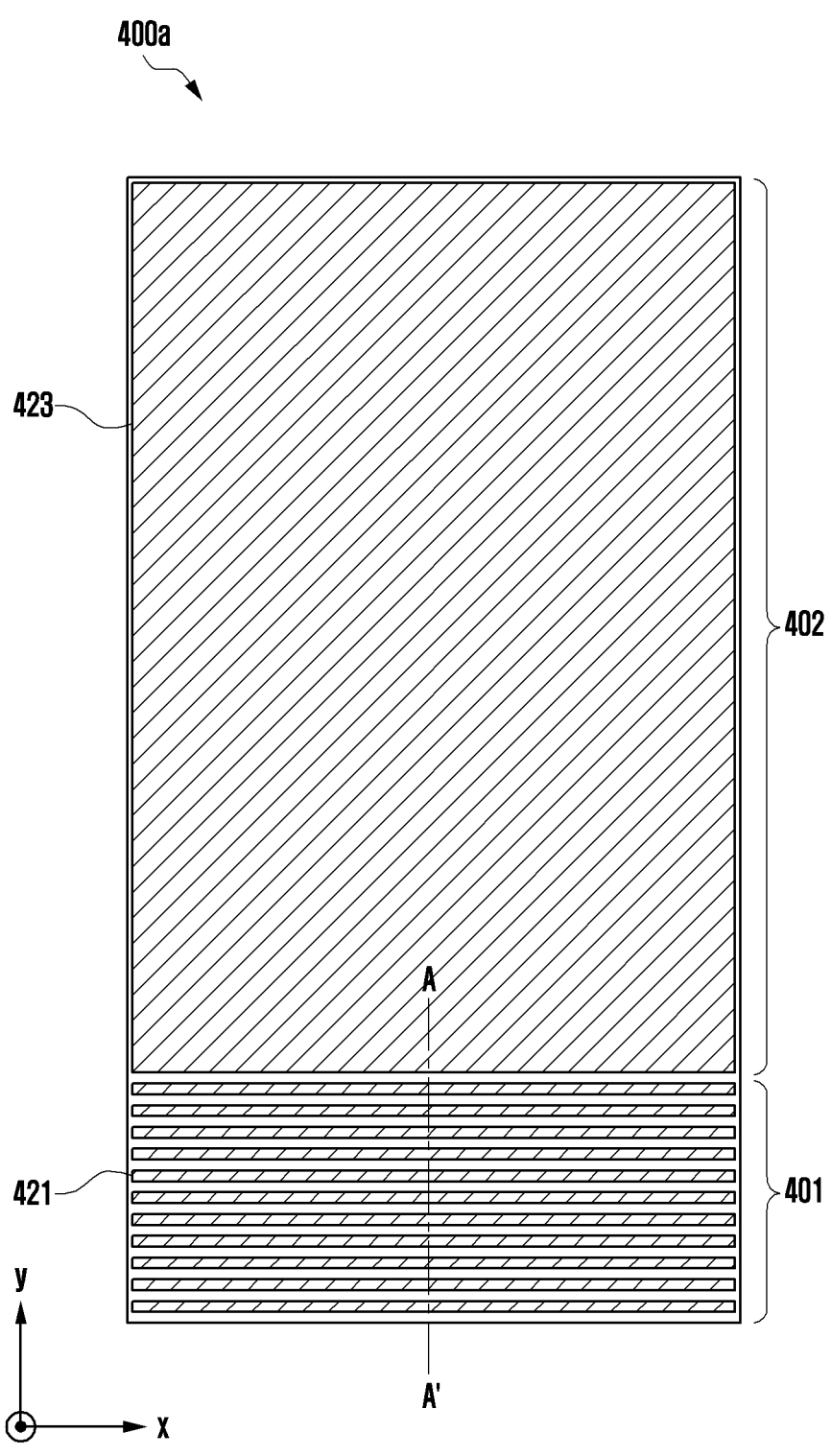
Figure 6B:
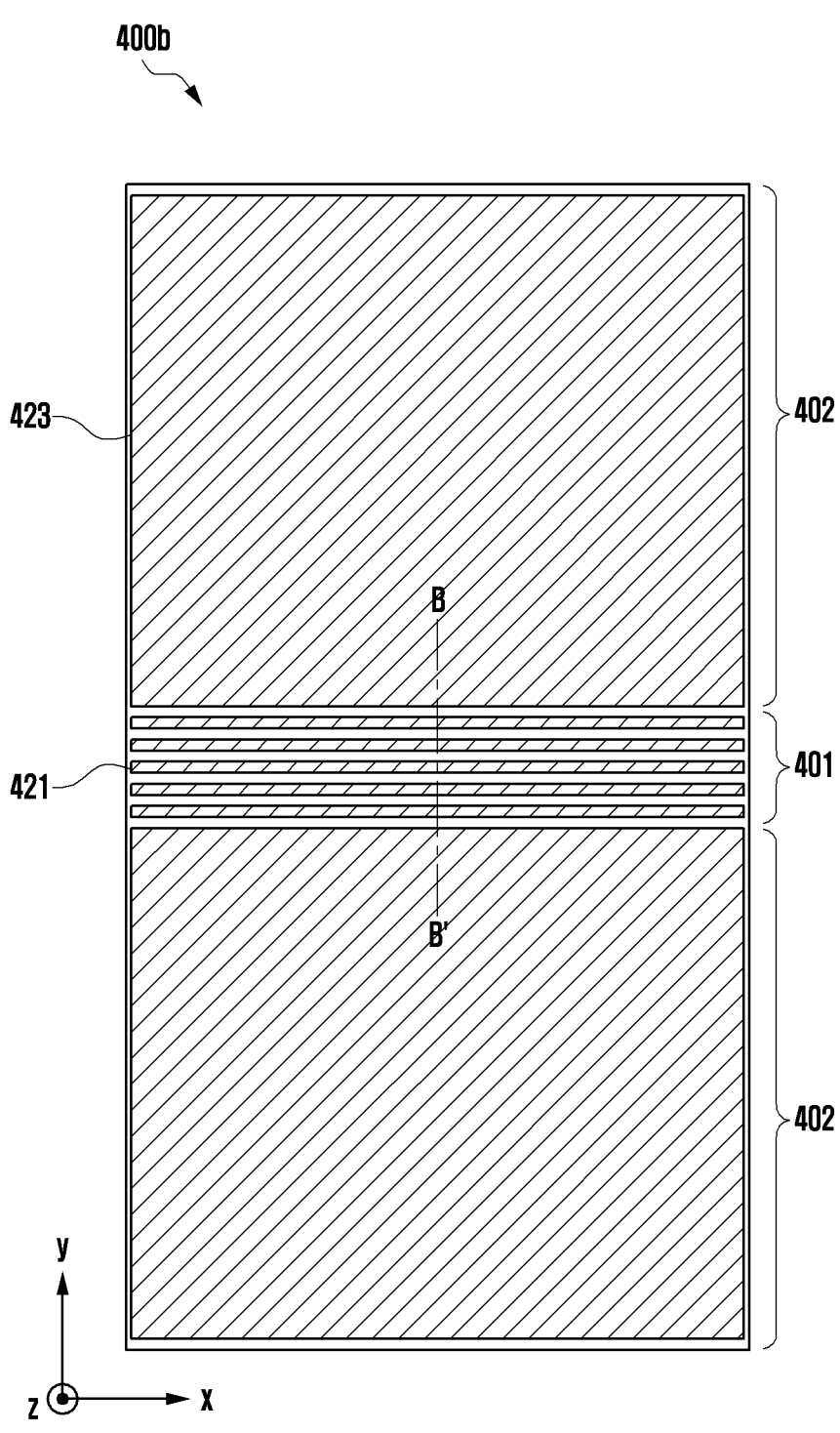
Figure 6C:
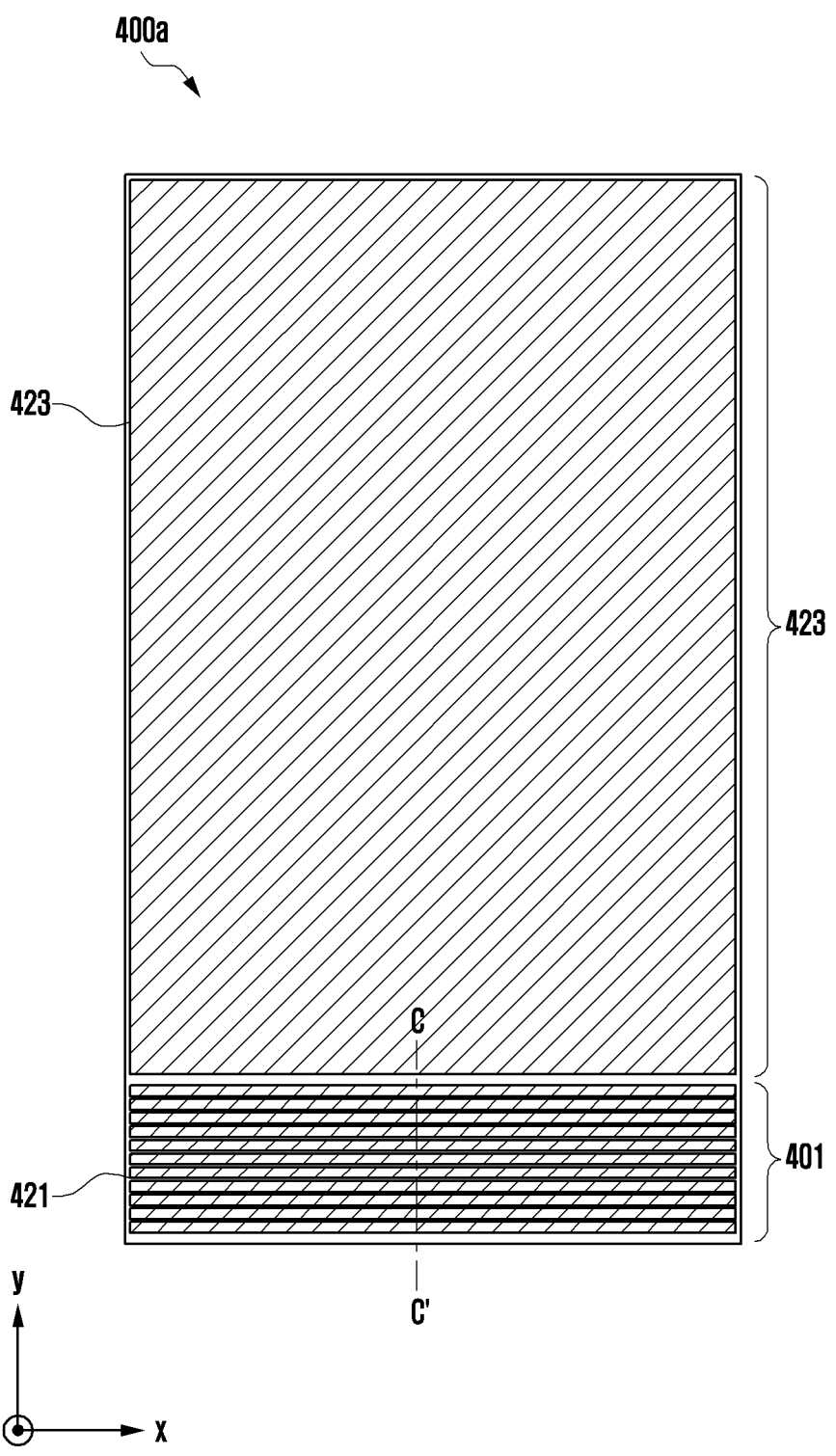

FIGS. 6A and 6C are plan views showing a flexible display 400*a* of a rollable electronic device according to various embodiments of the disclosure.

Figure 6D:
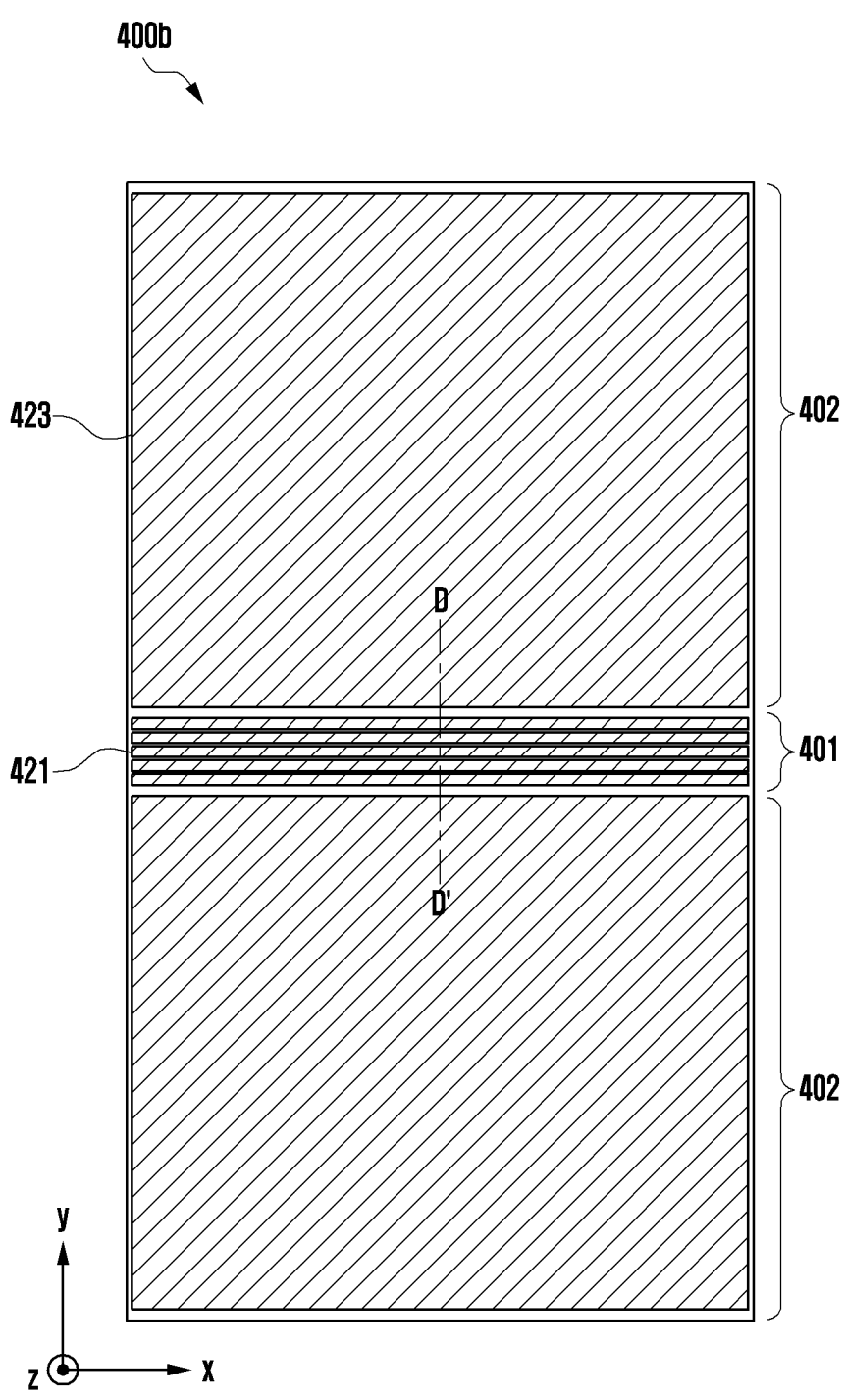

FIGS. 6B and 6D are plan views showing a flexible display 400*b* of a foldable electronic device according to various embodiments of the disclosure.

Figure 6E:
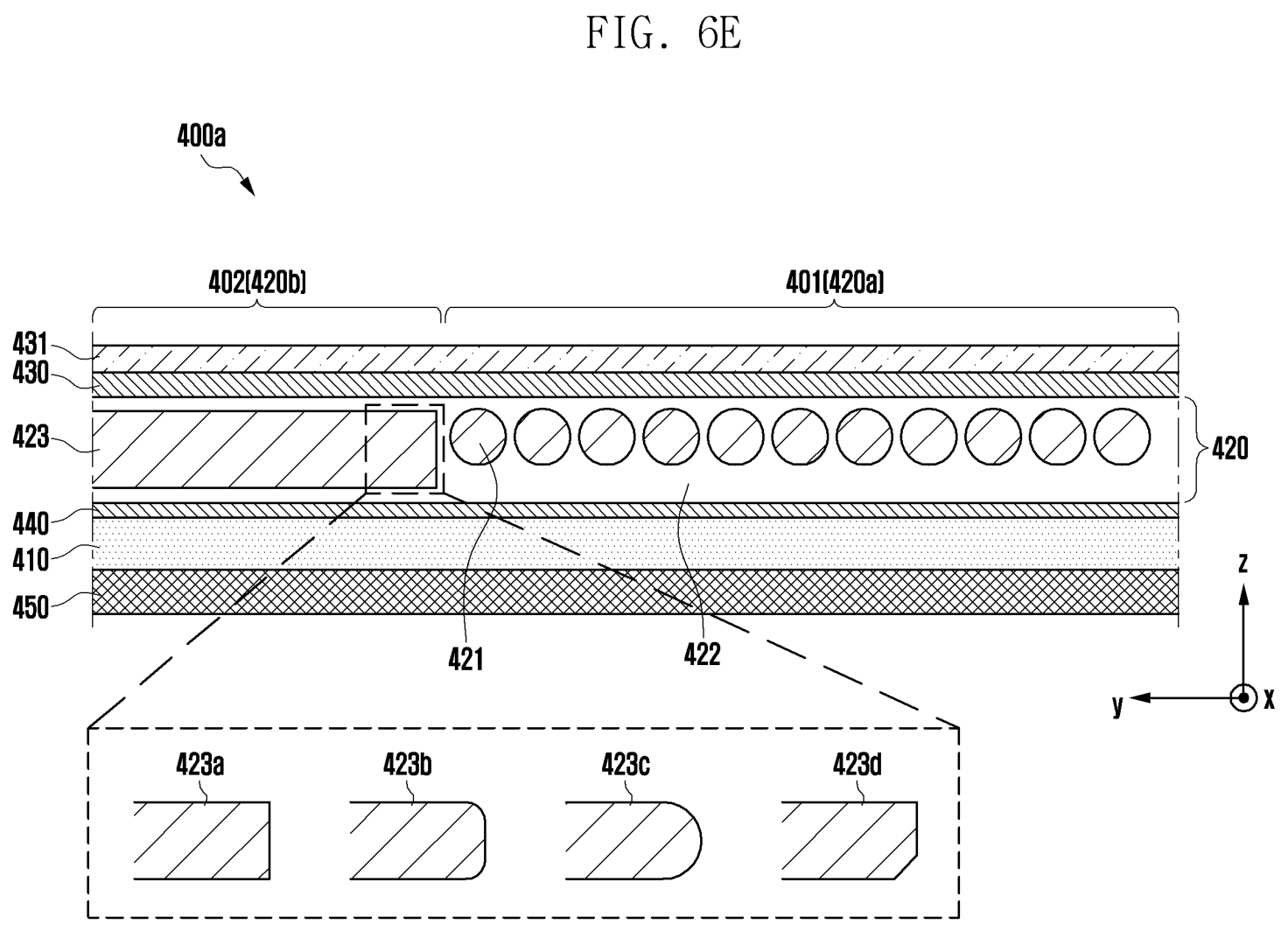

FIGS. 6E and 6G are cross-sectional views showing an unflexed state of a flexible display 400*a* of a rollable electronic device according to various embodiments of the disclosure.

Figure 6F:
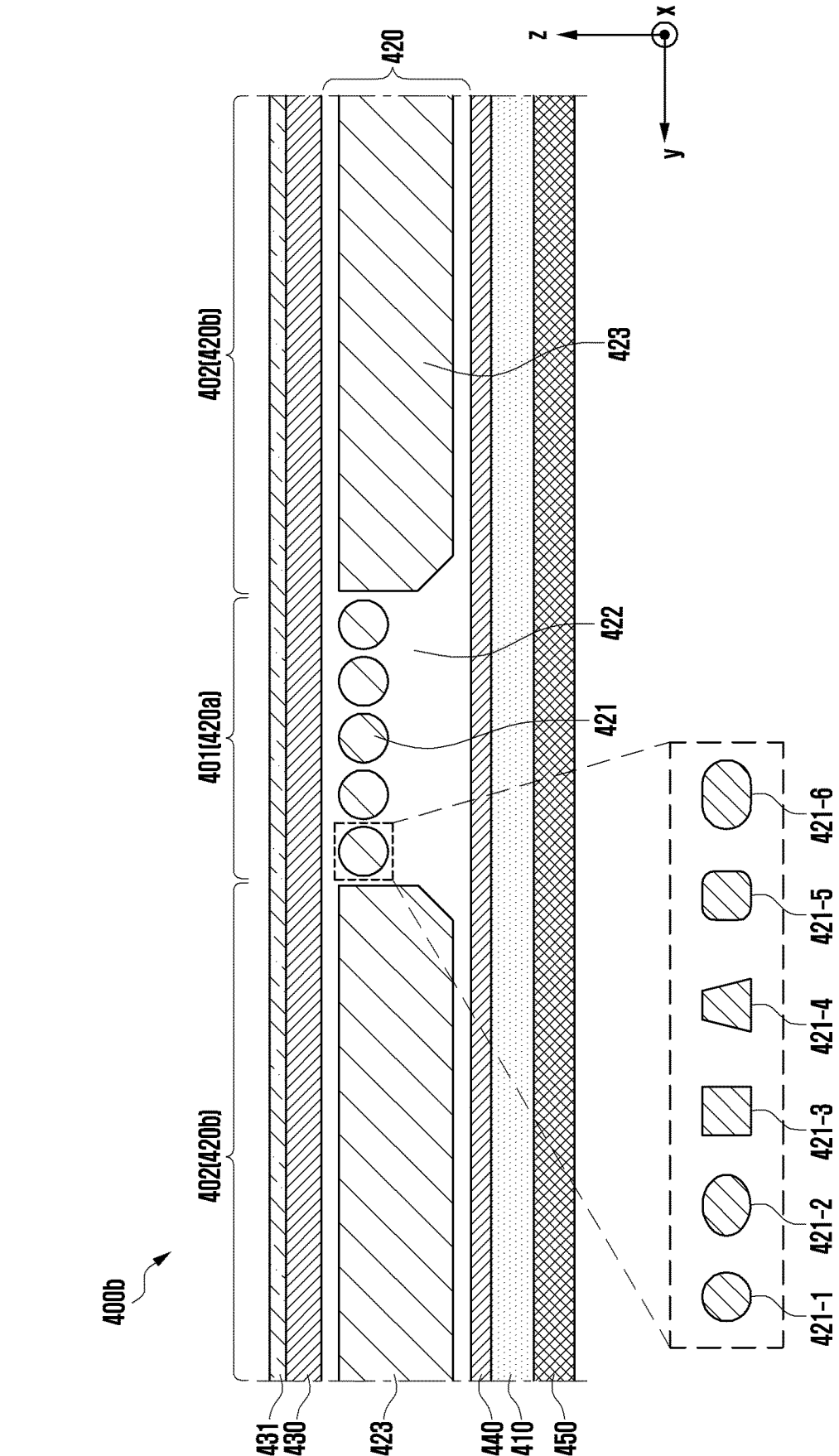
Figure 6G:
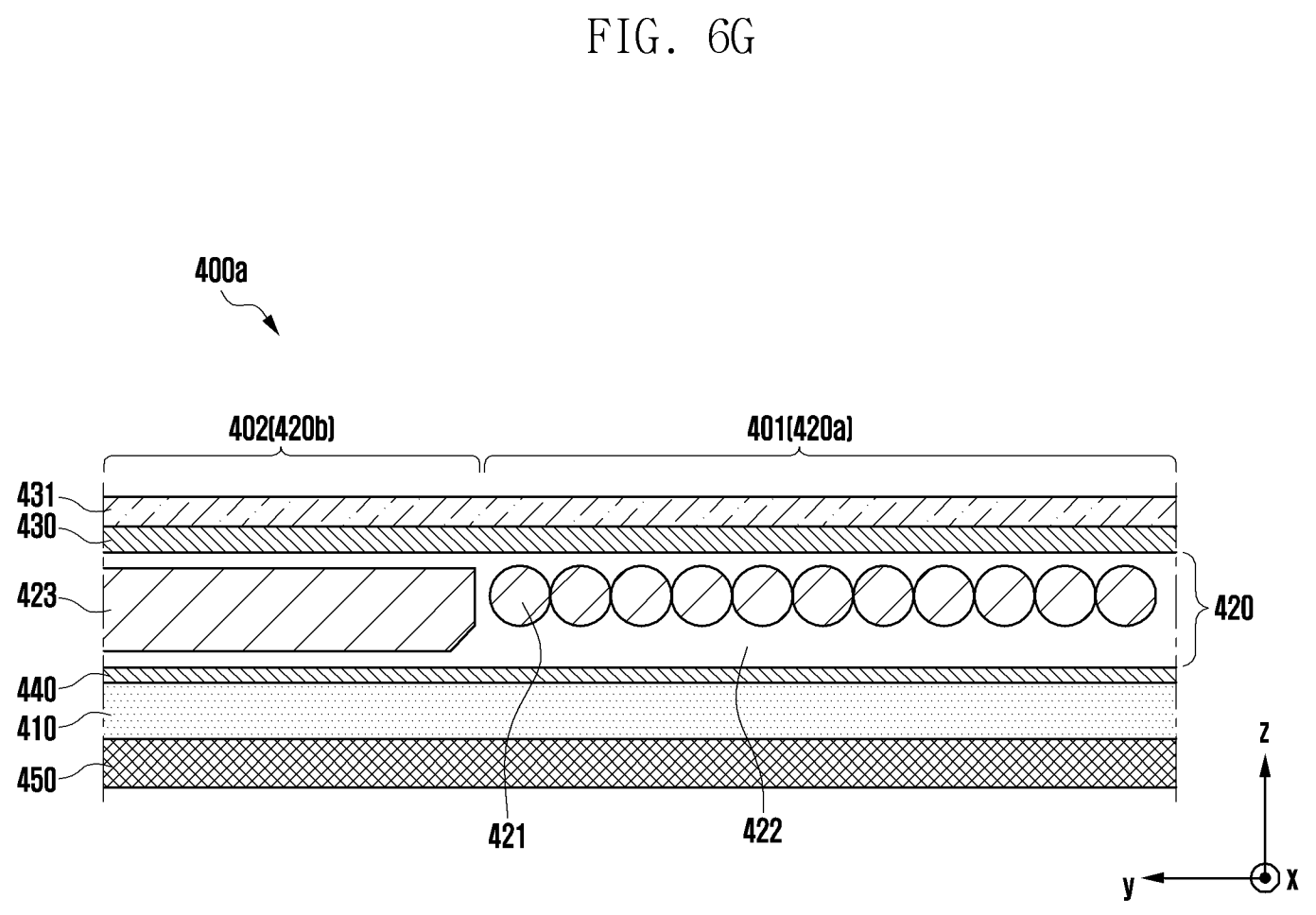
Figure 6H:
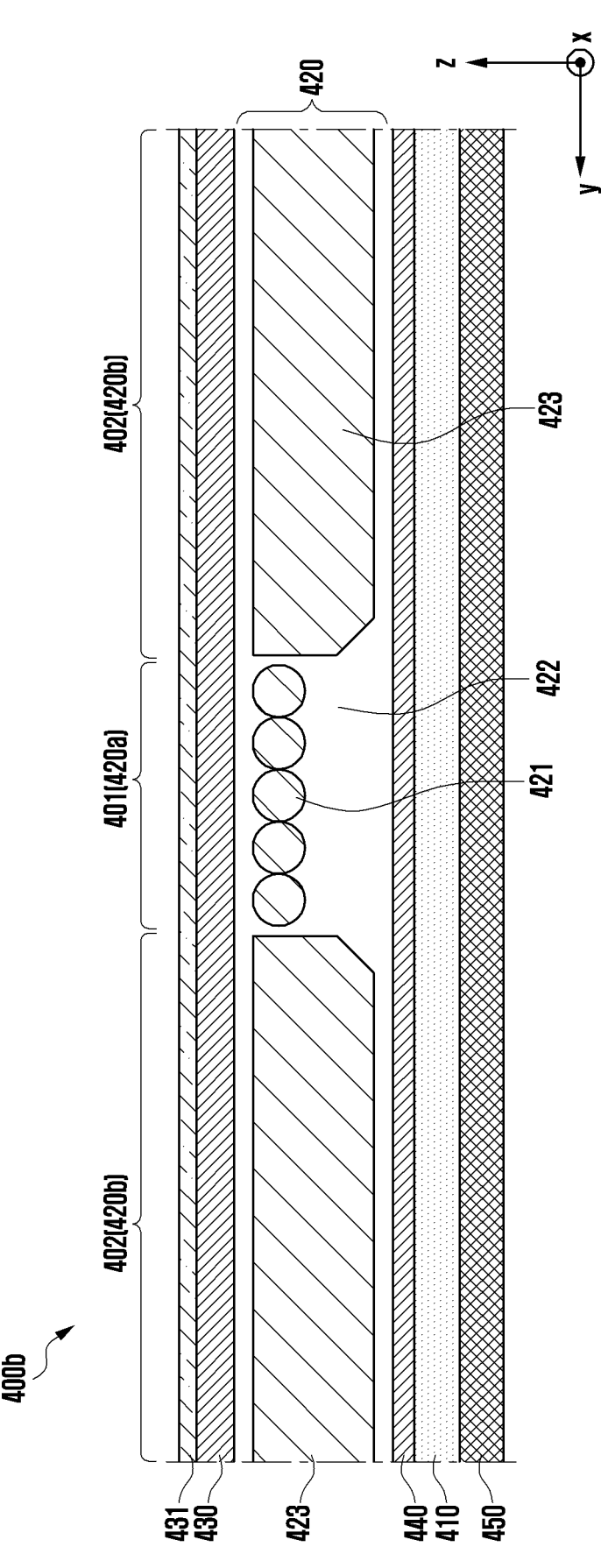

FIGS. 6F and 6H are cross-sectional views showing an unflexed state of a flexible display 400*b* of a foldable electronic device according to various embodiments of the disclosure.

Figure 6I:
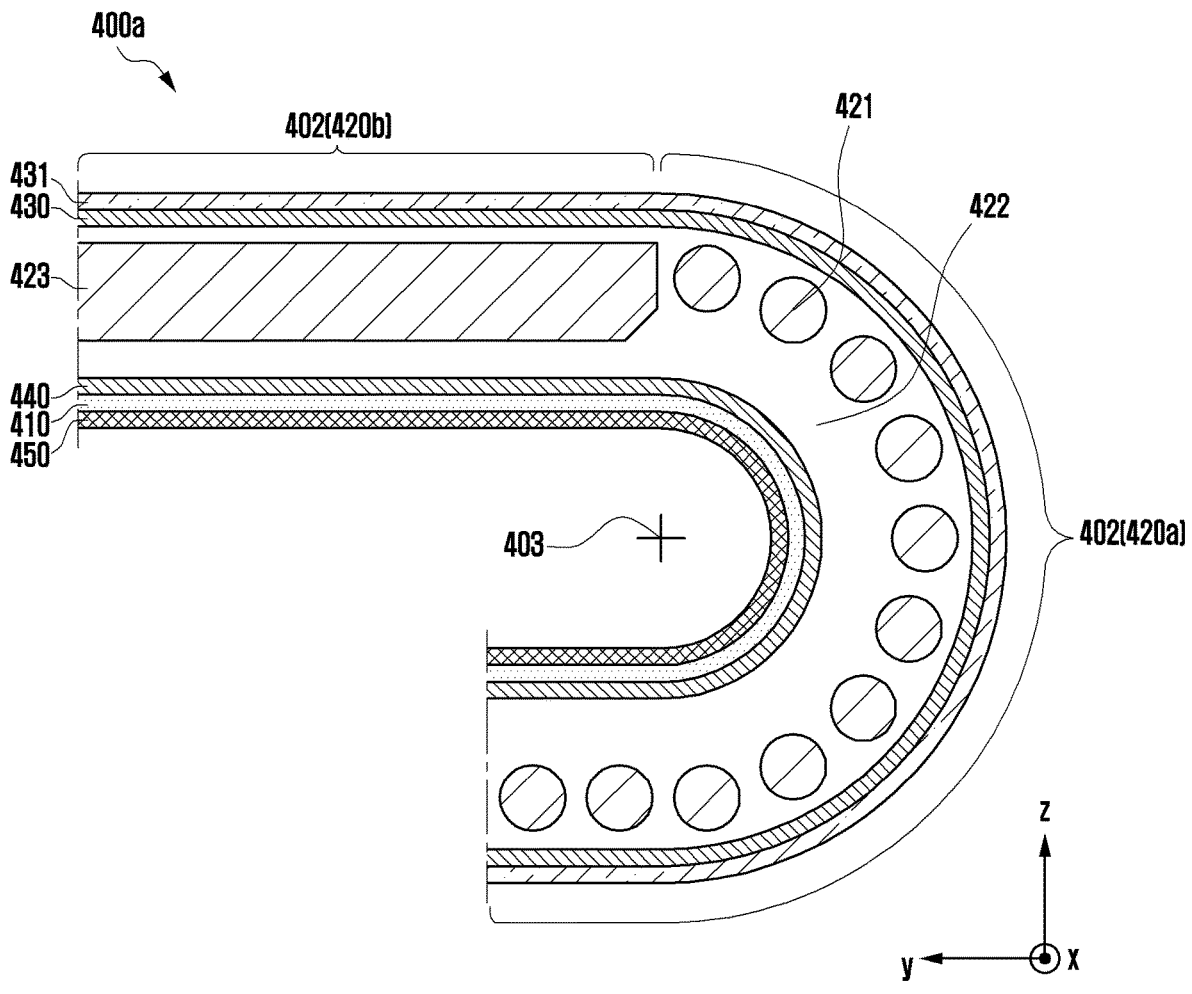

FIG. 6I is a cross-sectional view showing a flexed state of a flexible display 400*a* of a rollable electronic device according to an embodiment of the disclosure.

Figure 6J:
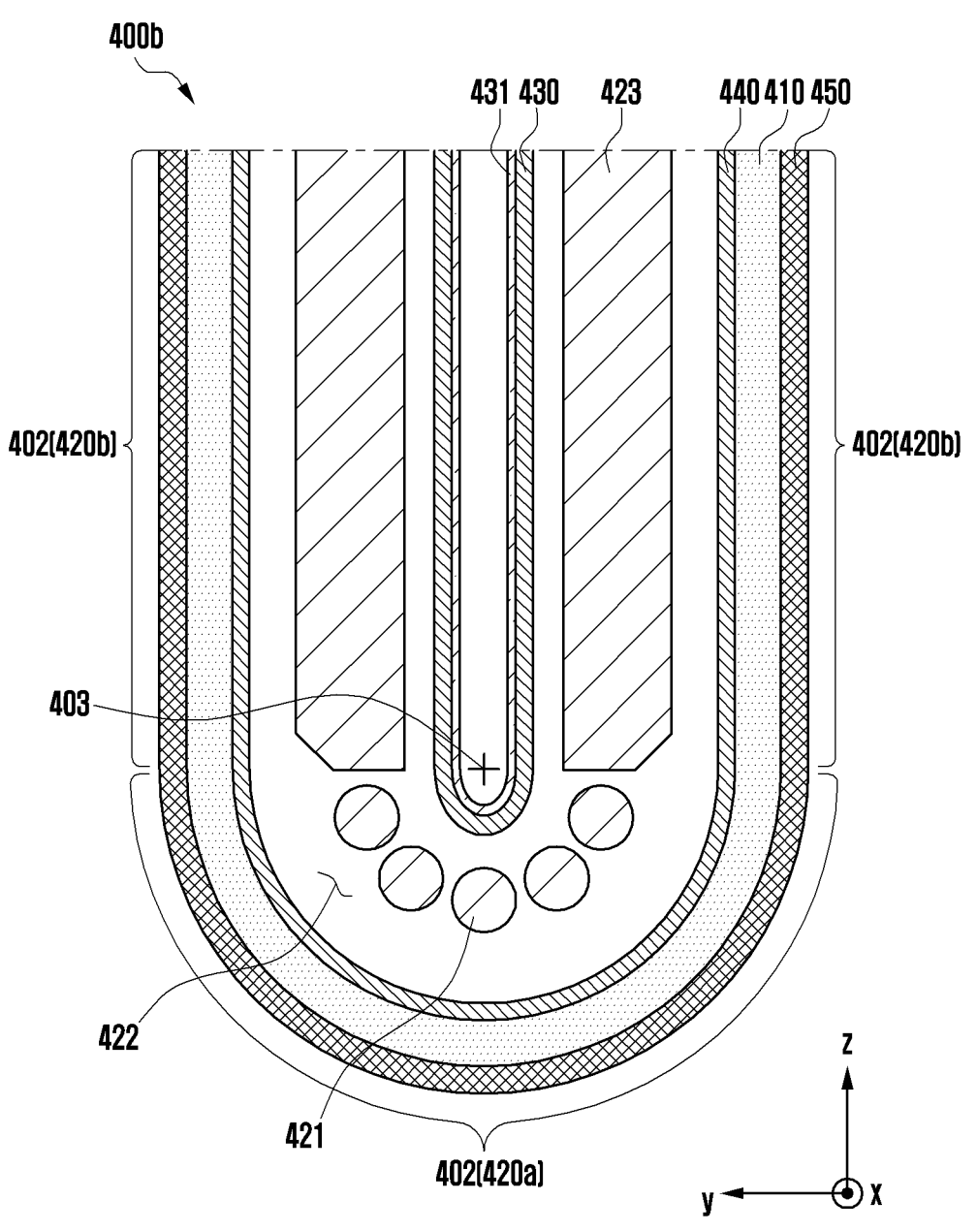

FIG. 6J is a cross-sectional view showing a flexed state of a flexible display 400*b* of a foldable electronic device according to an embodiment of the disclosure.

The cross-sectional view in FIG. 6E is a cross section cut along direction A-A' in FIG. 6A, and the cross-sectional view in FIG. 6F is a cross section cut along direction B-B' in FIG. 6B. The cross-sectional view in FIG. 6G is a cross section cut along direction C-C' in FIG. 6C, and the cross-sectional view in FIG. 6H is a cross section cut along direction D-D' in FIG. 6D.

Referring to FIGS. 6A to 6D, a flexible display 400*a* (e.g., the flexible display 230 in FIGS. 2A, 2B, 3A, 3B, and FIG. 4) of a rollable electronic device (e.g., the electronic device 101 or the electronic device 200 in FIGS. 2A, 2B, 3A, 3B, and FIG. 4) and a flexible display 400*b* (e.g., the flexible display 399 in FIGS. 5A to 5F) of a foldable electronic device (e.g., the electronic device 300 in FIGS. 5A to 5F) may have a first part 401 and a second part 402. The first part 401 may be a region of the flexible display 400*a* or 400*b*, which is bendable around a bending axis (e.g., the bending axis 403 in FIGS. 6I and 6J) such that the flexible display 400*a* or 400*b* switches between a flexed state and an unflexed state. The second part 402 may be a region which maintains a flat state and cannot be substantially flexed in the flexible display 400*a* or 400*b* during slide-in and slide-out operations of a rollable electronic device or folding and unfolding operations of a foldable electronic device.

Referring to FIGS. 6E to 6H, the flexible display 400*a* or 400*b* may include a flexible window 420 and a flexible display panel 410. The flexible display panel 410 may be a substrate which displays an image in one direction (for example, the z-direction in FIG. 6C) and has flexibility, and may be a display panel formed on an ultra-thin glass substrate or a polymer substrate and capable of displaying an image in a flexed state and an unflexed state. For example, the flexible display panel 410 may include a flexible OLED panel or the like. In various embodiments, the flexible display panel 410 may have a substantially rectangular planar shape.

The flexible window 420 may be a transparent panel positioned above the flexible display panel 410, based on a direction (for example, the z-direction) in which the image of the flexible display panel 410 is displayed, may be flexed together with the flexible display according to the bending of the flexible display 400*a* or 400*b*, and thus may protect the flexible display 400*a* or 400*b* from external impacts and foreign substances. In various embodiments, the flexible window 420 may have a three-dimensional shape in which a length (y-axis direction), thickness (z-axis direction), and width (x-axis direction) are defined, and may have a substantially rectangular planar shape. The flexible window 420 may include a first part 420*a* positioned in a region corresponding to the first part 401 of the flexible display 400*a* or 400*b*. The first part 420*a* may be a part of the flexible window 420 configured to be flexed or unflexed with the flexing and unflexing of the flexible display 400*a* or 400*b*.

In various embodiments, the flexible window 420 may also include a second part 420*b* positioned in a region corresponding to the second part 402 of the flexible display 400*a* or 400*b*. The second part 420*b* of the flexible window 420 may be a part that remains substantially unflexed during the flexing and unflexing of the flexible display 400*a* or 400*b*, and to substantially retain the flat shape. The second part 420*b* may include a flat-plate glass member 423. Since the second part 420*b* is a region among regions of the flexible display 400*a* or 400*b*, in which bending does not occur, the flat-plate glass member 423 may have a thick thickness, for example, a thickness exceeding 100 μm, compared to materials such as ultra-thin glass or transparent polyimide, and accordingly may have high impact resistance.

The first part 420*a* of the flexible window 420 may include multiple elongated glass members 421 and a first polymer layer (e.g. an optically transparent polymer 422). the elongated glass member 421 may be a glass member having a shape of a columnar body which has a base plane of a certain shape, and elongated therefrom. The elongated glass member 421 may be oriented to be parallel to the flat glass member 423 (e.g., oriented in the x-axis direction and parallel to the bending axis 403 of the flexible display 400*a* or 400*b*). In various embodiments, the length of the elongated glass member 421 may correspond to the width of the flexible window 420 (e.g., the width in the x-axis direction). For example, the width of the elongate glass member 421 may be substantially equal to the width of the flexible window 420. In other embodiments, the width of the elongate glass member 421 may be shorter than the width of the flexible window 420. This will be described later. Although FIGS. 6C and 6D illustrate the elongated glass member 421 having a circular cross section, this is merely exemplary. The term "columnar body" used in the specification is not limited to cylinders, elliptical cylinders or prisms, used as a term that also includes steric shapes having a base plane of various shapes such as polygons with rounded vertices and/or polygons with at least one side substituted with curved line, and elongated substantially vertical from the base plane. Thus in various embodiments of the disclosure, the shape of the elongated glass member 421 is not limited to the shape of a right circular cylinder. The multiple elongated glass members 421 may be arranged in a direction perpendicular to the bending axis 403 in the first part 420*a* of the flexible window 420, for example, in the y-direction. The elongated glass member 421 may include various chemical or thermally tempered glass materials. According to an embodiment of the disclosure, the elongated glass member 421 may have a thickness of 30 to 450 μm in order to have high impact resistance. In case that the thickness of the elongated glass member 421 is 30 μm or less, the impact resistance and rigidity of the first part 420*a* become too low and thus the elongated glass member 421 may be easily broken, and in case that the thickness thereof exceeds 450 μm, it may be difficult to properly deform the optically transparent polymer 422 in order to bend the first part 420*a*.

The elongated glass member 421 may be a member which protects the first part 420*a* of the flexible display 400*a* or 400*b* from external stress such as impacts and/or pressures applied from the upper side (the z-direction) thereof and prevents damage thereof. Since the first part 420*a* includes the elongated glass members 421, the flexible window 420 may have high impact resistance and also good flexibility due to the thick thickness thereof, compared to a window according to a comparative example, such as an ultra-thin glass requiring a thickness of about 100 μm or less in order to have flexibility. In addition, due to inclusion of the multiple elongated glass members 421, in case that a crack occurs in one among the multiple elongated glass members 421, since the occurrence of the crack is limited to the corresponding elongated glass member 421, it may be possible to prevent a crack, which occurs in a portion of the first part 420a of the flexible window 420, from spreading throughout the first part 420a or the flexible window 420. Therefore, even though external stress exceeding the impact resistance limitation of a window is applied to the flexible display 400a or 400b, the possibility that the flexible display 400a or 400b is damaged to a completely unusable extend may be decreased.

The optically transparent polymer 422 may be a material coupled to the multiple elongated glass members 421 such that the multiple elongated glass members 421 are coupled to each other. The optically transparent polymer 422 may be a polymer filled in the first part 420a, and in some embodiments, may be a cured (for example, ultraviolet (UV), chemical, or thermal curing) material applied in a resin state. The optically transparent polymer may be directly coupled to the surface of the elongated glass member 421, or as described below, may be indirectly coupled to the elongated glass member 421 while having a member such as a polymer coating layer 424 and/or a bundling member 426 interposed therebetween. For example, the optically transparent polymer 422 and the elongated glass member 421 may be coupled to each other by the viscosity or adhesiveness of the optically transparent polymer 422 itself. The optically transparent polymer 422 may be a flexible polymer material having flexibility, and may have an elastic modulus (or an elastic coefficient) of about 300 mega pascal (MPa) or less. In this regard, a more detailed description will be given below.

The optically transparent polymer 422 may include various optically transparent resins such as an optical grade polyurethane, silicone, acrylic, polyvinyl acetate, epoxy resin, or a mixture including at least one thereof. Optical properties, such as a refractive index and/or a dispersion index, of the optically transparent polymer 422 may be similar to the elongated glass member 421, and preferably, the optical properties thereof may be adjusted to have substantially the same optical properties as the elongated glass members 421. Accordingly, distortion of an image displayed on the flexible display panel 410 due to refraction of light generated in the elongated glass member 421 may be reduced.

Referring to FIG. 6E, the end of the flat-plate glass member 423, which is adjacent to the first part 420a, may be an end 423a having a rectangular cross-sectional shape, and may be an end 423b having a rounded corner or an end 423c having a semicircular cross-sectional shape, in order to prevent stress concentration on corners and thus increase structural strength and in order to reduce degradation in visibility due to a sudden change in optical properties at the end of the flat-plate glass member 423. According to another embodiment of the disclosure, the end of the flat-plate glass member 423 may be an end 423d having a cross-sectional shape in which at least one corner thereof is chamfered. The chamfering of corners may be easily performed on the relatively thin flat-plate glass member 423 compared to a rounding process, and thus it may be possible to reduce the stress concentration on the corners thereof. It will be apparent to those skilled in the art that the above description of the distal end of the flat-plate glass 423 of FIG. 6E can be equally applied to flat-plate glass 423 of FIG. 6F or any flat-plate glass 423 according to various embodiments of the present invention.

Referring to FIG. 6F, elongated glass member 421 according to various embodiments may have various cross-sections such as: circular 421-1, elliptical 421-2, polygonal (e.g. quadrangular 421-3 and/or trapezoidal 421-4), polygonal with rounded corners 421-5, and/or a stadium shaped 421-6. Elongated glass 421 with circular 421-1 and elliptical 421-2 cross-section can reduce physical interference between adjacent elongated glass members 421, so that the folding operation of the flexible window 420 is smooth. Elongated glass member 421 with polygonal 421-3 or 421-4 cross section may prevent and/or minimize deterioration of image quality due to refraction that occurs as light passes through a curved surface. Elongated glass member 421 with cross-sectional shape in which the width gradually decreases in one direction, such as the trapezoid 421-1, may reduce interference between the columnar glass 421 when the flexible window 420 is folded. The polygon with rounded corners 421-5 and/or the stadium shape 421-6 can reduce deterioration of image quality, while also smoothening the folding operation.

In the embodiments illustrated in FIGS. 6E to 6J, a protective film 430 may be positioned on the window, based on a direction (the z-direction) in which the image of the flexible display 400a or 400b is displayed. The protective film 430 may be a layer for protecting the soft optically transparent polymer 422 from the outside. The protective film 430 may be attached on the surface of the flexible window 420 by means of an optically clear adhesive (OCA), preferably a material similar to the optically transparent polymer 422 of the first part 420a.

According to an embodiment of the disclosure, the protective film 430 may include a polymer material including polyethylene terephthalate (PET), transparent polyimide, polyurethane, or a mixture thereof. According to another embodiment of the disclosure, the protective film 430 may include thermally tempered or chemically tempered ultrathin glass (UTG).

In the embodiments illustrated in FIGS. 6E to 6J, a hard coating layer 431 may be formed on the upper surface thereof, based on a direction (the z-direction) in which the image of the flexible display 400a or 400b is displayed. The hard coating layer 431 may be a layer having a hardness higher than the matrix of the protective film 430, and may include a layer formed by applying a coating solution containing a photoinitiator onto the surface of the protective film 430 and then emitting ultraviolet rays to cure same. The hard coating layer 431 may protect the flexible display 400a or 400b and the protective film 430 from damage such as scratches.

As illustrated in FIGS. 6E to 6J, a window rear film 440 may be positioned on the lower surface (the surface in the −z-direction) of the flexible window 420, based on a direction in which the image of the flexible display 400a or 400b is displayed. The rear film 440 may seal the optically transparent polymer 422 of the window so as to limit a movement of the elongated glass members 421 and block direct contact between the flexible display panel 410 and the optically transparent polymer 422. The material of the rear film 440 may be the same as or similar to the material of the above-described protective film 430. The rear film 440 may include an optically clear adhesive (OCA) positioned on the surface in contact with the optically transparent polymer 422 and attached to the optically transparent polymer 422.

A support layer 450 may be positioned on the lower part (the −z-direction) of the flexible display panel 410. The support layer 450 may help to reinforce rigidity of the electronic device 101, may shield ambient noise generated from other elements of the electronic device 101, and may be used to dissipate heat generated during an operation of the flexible display panel 410. The support layer 450 may include a metal material. The metal may have electrical and thermal conductivity so that noise is effectively blocked and heat is effectively spread. The metal may include stainless steel, aluminum, copper, or a composite (e.g., a member in which different types of metals are stacked in a plate shape) thereof. The support layer 450 may include a lattice plate structure which can be flexed following a bending operation of the flexible display 400a or 400b and can mechanically support elements of the flexible display 400a or 400b.

In the embodiment illustrated in FIGS. 6E and 6F, the multiple elongated glass members 421 may be spaced apart from each other, and the spaces between the elongated glass members 421 may be filled with the optically transparent polymer. In the embodiment illustrated in FIGS. 6G and 6H, in another embodiment, the multiple elongated glass members 421 may be in contact with each other. In case that the multiple elongated glass members 421 are in contact with each other, the rigidity and impact resistance of the first part 420a may be increased. In addition, in case of the multiple elongated glass members 421 are arranged to be spaced apart from each other while having a gap therebetween, the flexibility of the first part 420a may be increased. The gap between the multiple elongated glass members 421 may be determined as a value capable of optimizing the flexibility, rigidity, and impact resistance of the first part.

Referring to FIGS. 6I and 6J, in the flexible display 400a or 400b including the elongated glass members 421 arranged in the first part 420a, the first part 420a may be flexed around the bending axis 403. In case that the first part 420a is flexed, the multiple elongated glass members 421 included in the first part 420a may be moved to a position corresponding to the flexed shape of the first part 420a. In addition, the state in which the multiple elongated glass members 421 are attached to each other due to the bending thereof, may be maintained. Therefore, the first part may have a thick thickness and thus high impact resistance compared to the material of a window according to a comparative example, such as a polyimide film or ultra-thin glass.

In case that the flexible display 400a or 400b is flexed, the elongated glass members 421 arranged in the first part 420a may move in a direction including the thickness-direction component of the window. The above-described movement may be due to the micro-viscoelastic behavior of the optically transparent polymer 422. Since the protective film 430 attached to the surface of the flexible display 400a or 400b according to a comparative example has relatively high rigidity, deformation due to a buckling or an elastic instability similar thereto may occur, and thus there may be a risk that the protective film 430 is detached from the surface of the first part 420a of the flexible display 400a or 400b. In the flexible display 400a or 400b according to various embodiments of the disclosure, since the optically transparent polymer 422 of the first part 420a is a soft material compared to the protective film 430 and thus the elongated glass members 421 are moved by the optically transparent polymer 422, an elastic instability applied to the protective film 430 may be at least partially solved so that the risk of detachment of the protective film 430 may be reduced.

Figure 7A:
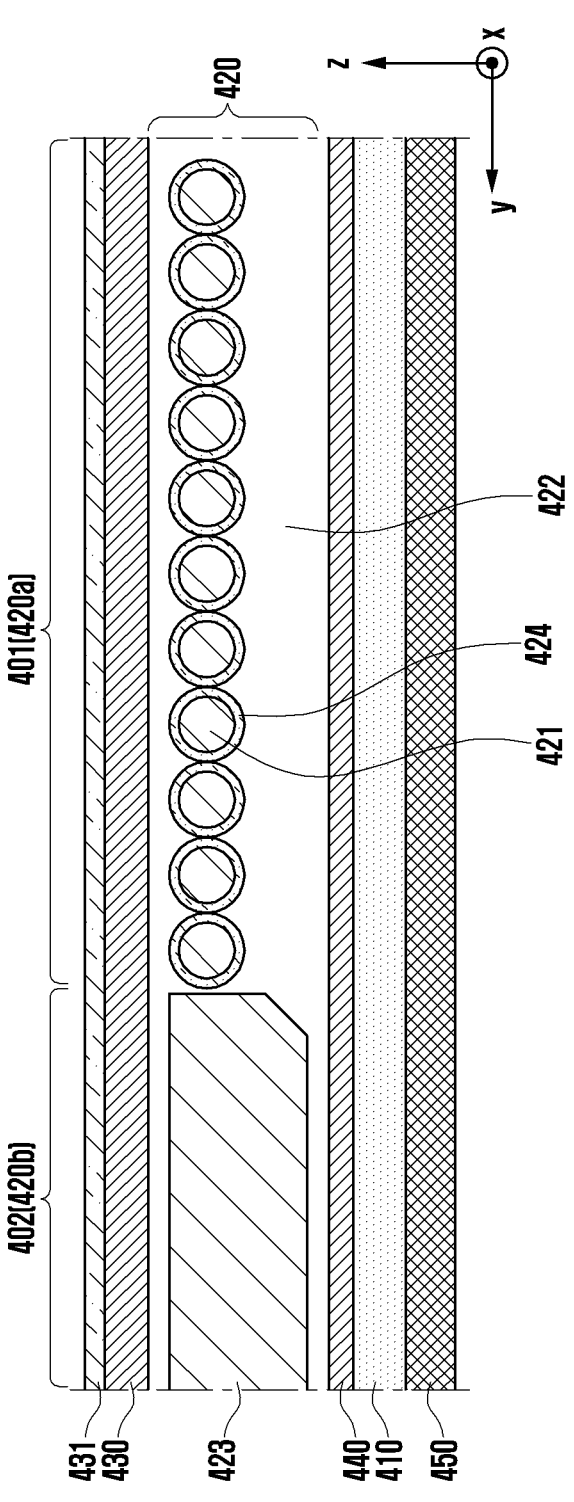
FIG. 7A is a cross-sectional view showing a flexible display according to an embodiment of the disclosure.

FIG. 7A is a cross-sectional view showing a flexible display 400a or 400b according to an embodiment of the disclosure.

Figure 7B:
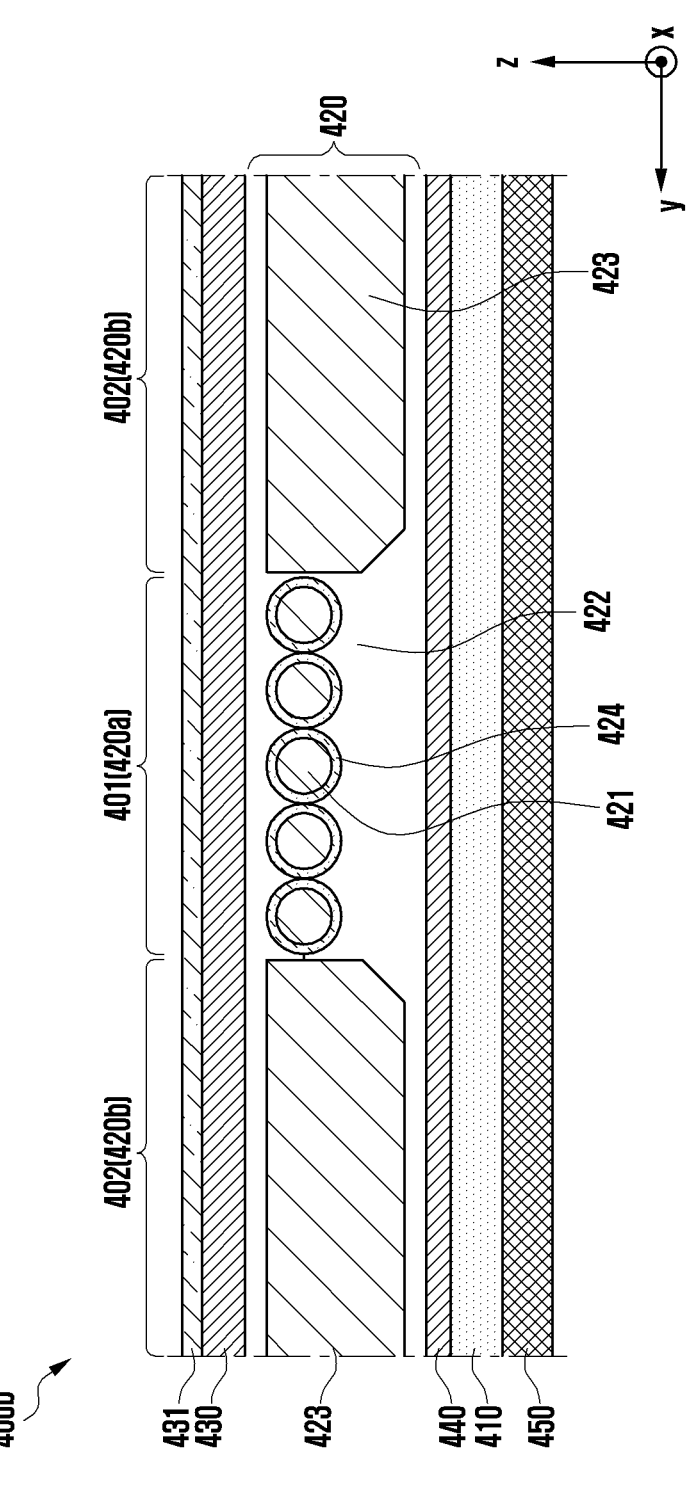
FIG. 7B is a cross-sectional view showing a flexible display according to an embodiment of the disclosure.

FIG. 7B is a cross-sectional view showing a flexible display 400a or 400b according to an embodiment of the disclosure.

Referring to FIGS. 7A and 7B, each of the elongated glass members 421 of the flexible display 400a or 400b may include a second polymer layer (e.g. polymer coating layer 424) coated on at least a part of the outer perimeter surface of each of the elongated glass members 421. The polymer coating layer 424 may prevent damage which occurs on the surface thereof in the handling process of the elongated glass members 421 during the manufacturing of the flexible display 400a or 400b according to various embodiments of the disclosure. The polymer coating layers 424, which are respectively coated on the multiple elongated glass members 421, may be connected to each other. The polymer coating layer 424 may have an elastic modulus value different from the elastic modulus value of the optically transparent polymer 422. According to an embodiment of the disclosure, the polymer coating layer 424 may have an elastic modulus higher than the optically transparent polymer 422. In case that an external impact is applied to the flexible display 400a or 400b, the impact force may be reduced by ductility of the optically transparent polymer 422 having a relatively low elastic modulus, the rigidity of the elongated glass member 421 may be reinforced by the polymer coating layer 424 having a relatively high elastic modulus, and thus it may be possible to increase the impact resistance of the elongated glass member 421. According to another embodiment of the disclosure, the polymer coating layer 424 may have a lower elastic modulus compared to the optically transparent polymer 422. Since the optically transparent polymer 422 has a relatively high rigidity, the optically transparent polymer may resist deformation due to an impact from the outside, and since the polymer coating layer 424 has relatively high ductility, the polymer coating layer may absorb the impact delivered to the elongated glass members 421.

The elongated glass member 421, the polymer coating layer 424, and the optically transparent polymer 422 may have similar or substantially the same optical properties such as a refractive index and/or a dispersion index. In addition, the boundary surfaces between the elongated glass members 421, the polymer coating layer 424, and the optically transparent polymer 422 may be completely attached to each other so that a decrease in visibility is reduced.

Figure 8A:
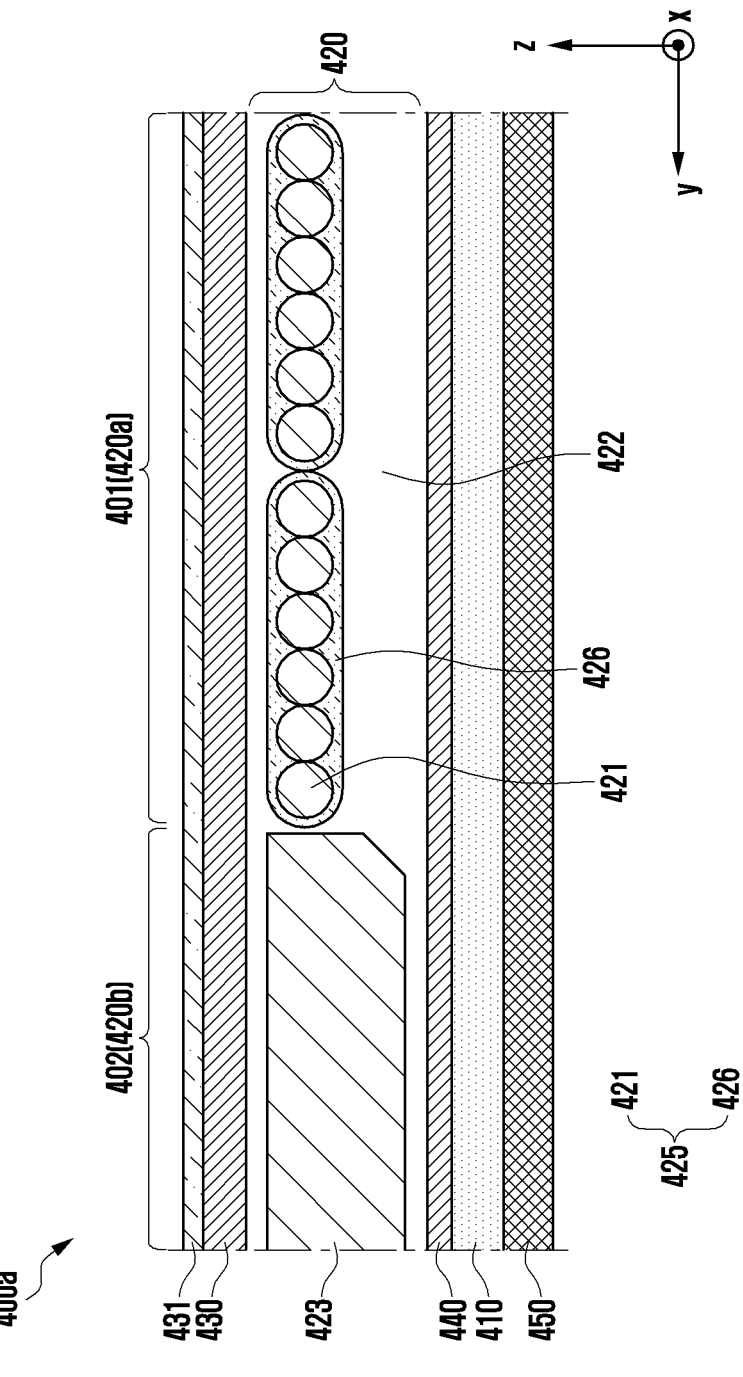
FIG. 8A is a cross-sectional view showing a flexible display according to an embodiment of the disclosure.

FIG. 8A is a cross-sectional view showing a flexible display according to an embodiment of the disclosure.

Figure 8B:
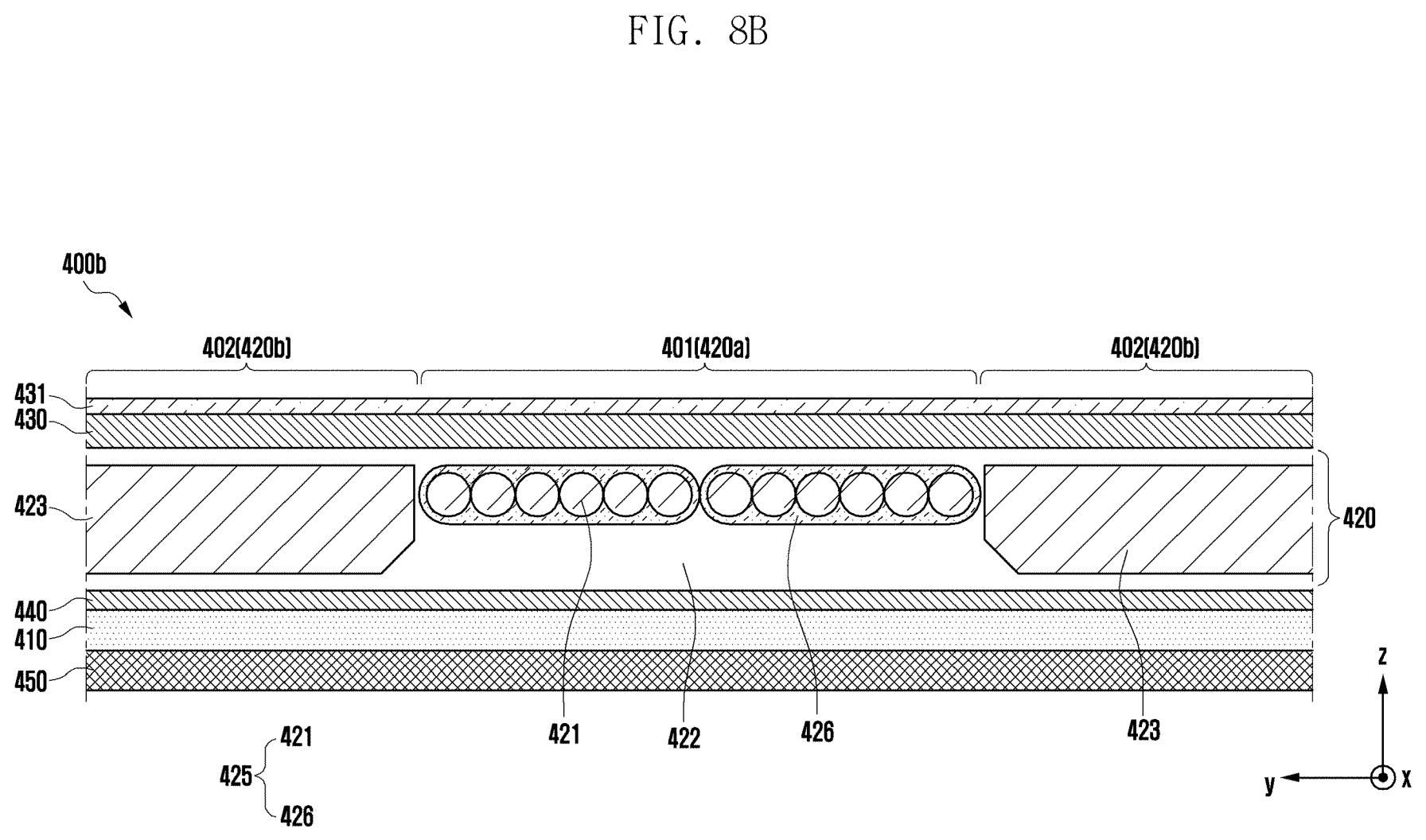

FIG. 8B is a cross-sectional view showing a flexible display according to an embodiment of the disclosure.

Figure 8C:
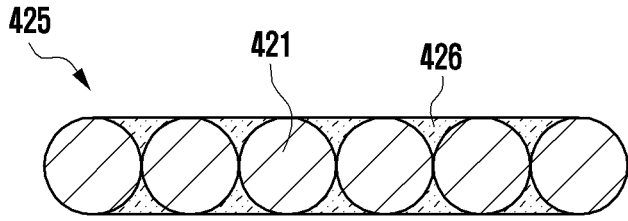
FIG. 8C is a cross-sectional view showing an elongated glass member of a flexible display according to an embodiment of the disclosure.
Figure 8C:
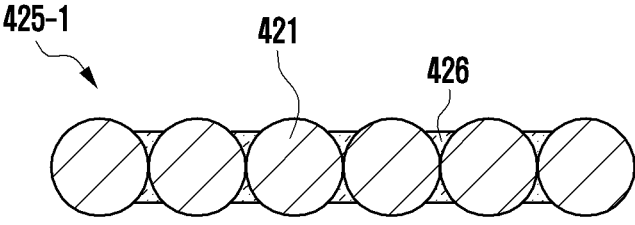
Figure 8C:
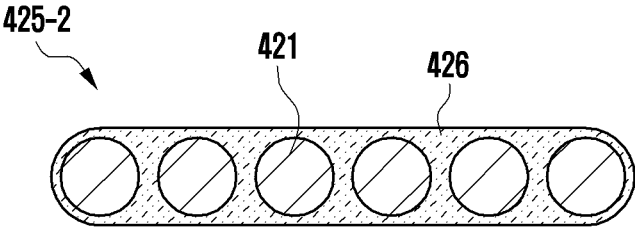

FIG. 8C is a cross-sectional view showing an elongated glass member of a flexible display according to an embodiment of the disclosure.

Referring to FIGS. 8A, 8B, and 8C, the multiple elongated glass members 421 of the flexible display 400a or 400b may be bundled into a bundle 425 by a bundling member 426. The bundling member 426 may include various optical grade polymer materials which surround and bundle the outer perimeter of the multiple elongated glass members 421. The number of the elongated glass members 421 bundled with the bundle 425 may be increased or decreased in consideration of a bending radius and flexibility of the first part 420a. The first part 401 of the flexible display 400a or 400b may include one bundle 425 or multiple bundles 425. Although FIG. 8A illustrates an embodiment in which the first part 401 includes two bundles 425, the disclosure is not limited thereto, and it will be apparent that the first part 401 may include more than one bundle.

The bundling member 426 may enable the multiple elongated glass members 421 to be easily aligned parallel to each other during the manufacturing of the flexible display 400a or 400b. In addition, since the multiple elongated glass members 421 are connected to each other by the bundling member 426, excessive deviation or protrusion of an individual elongated glass member 421 from the arrangement region of the elongated glass members 421 may be reduced during a bending operation of the flexible display 400a or 400b.

The bundling member 426 may have an elastic modulus different from the optically transparent polymer 422. For example, the bundling member 426 may have a higher elastic modulus compared to the optically transparent polymer 422. In case that an external impact is applied to the flexible display 400a or 400b, the impact force may be reduced by ductility of those (for example, the optically transparent polymer 422) having a low elastic modulus among the bundling member 426 or the optically transparent polymer 422, the rigidity of the elongated glass member 421 may be reinforced by those (for example, bundling member 426) having a high elastic modulus, and thus it may be possible to increase the impact resistance of the elongated glass member 421. In addition, the elongated glass members 421, the bundling member 426, and the optically transparent polymer 422 may have similar or substantially the same optical properties such as a refractive index and/or a dispersion index.

Referring to FIG. 8C, according to an embodiment of the disclosure, the thickness of the bundle 425 may be the same as the diameter of the elongated glass member 421, and the bundling member 426 may be filled in the spaces between the multiple elongated glass members 421 so as to attach the multiple elongated glass members 421 to each other. According to another embodiment of the disclosure, a bundle 425-1 may include a bundling member 426 positioned in a part of the space between the multiple elongated glass members 421. According to another embodiment of the disclosure, the thickness of a bundle 425-2 may be greater than the diameter of the elongated glass member 421, and a bundling member 426 may entirely surround the multiple elongated glass members 421 at the outer perimeter thereof.

Figure 9A:
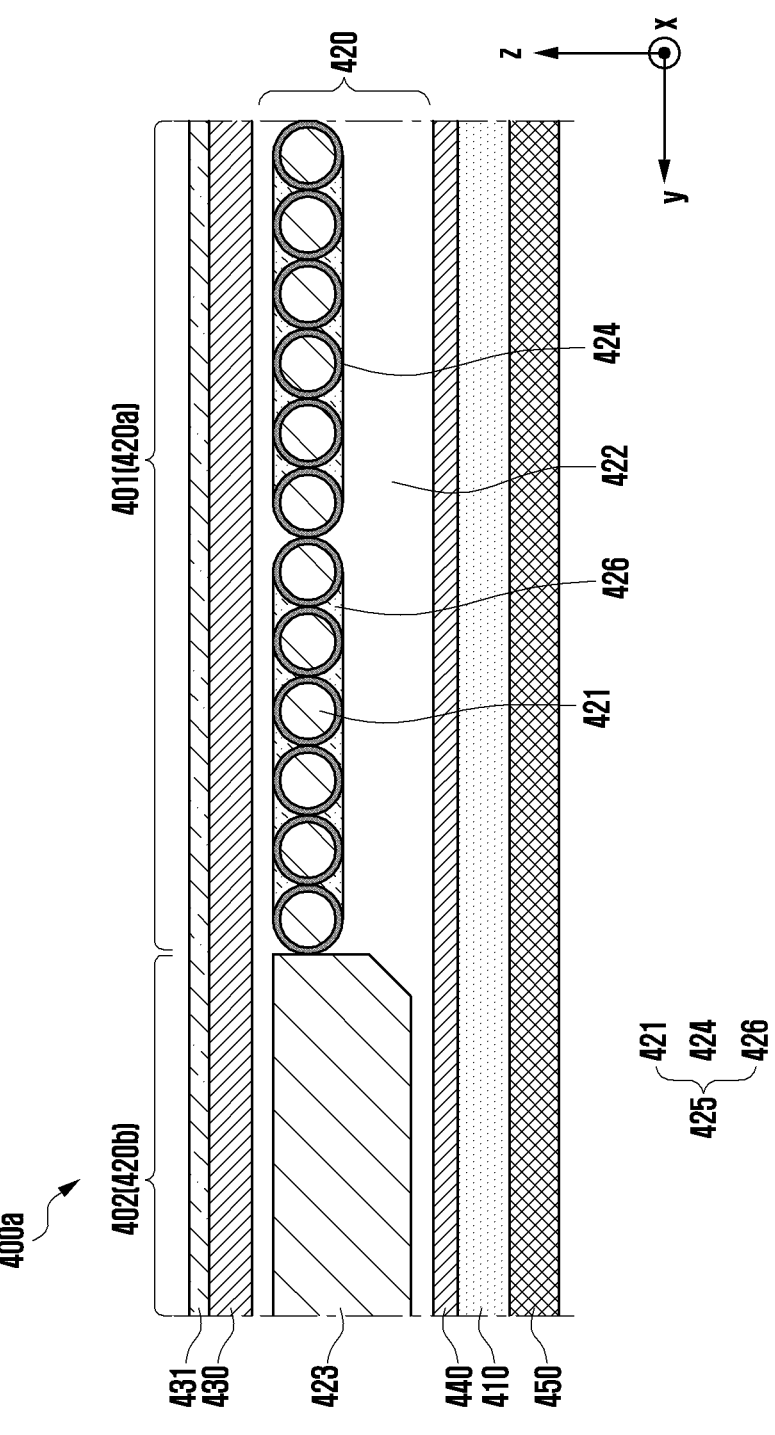
FIG. 9A is a cross-sectional view showing a flexible display according to an embodiment of the disclosure.

FIG. 9A is a cross-sectional view showing a flexible display 400a or 400b according to an embodiment of the disclosure.

Figure 9B:
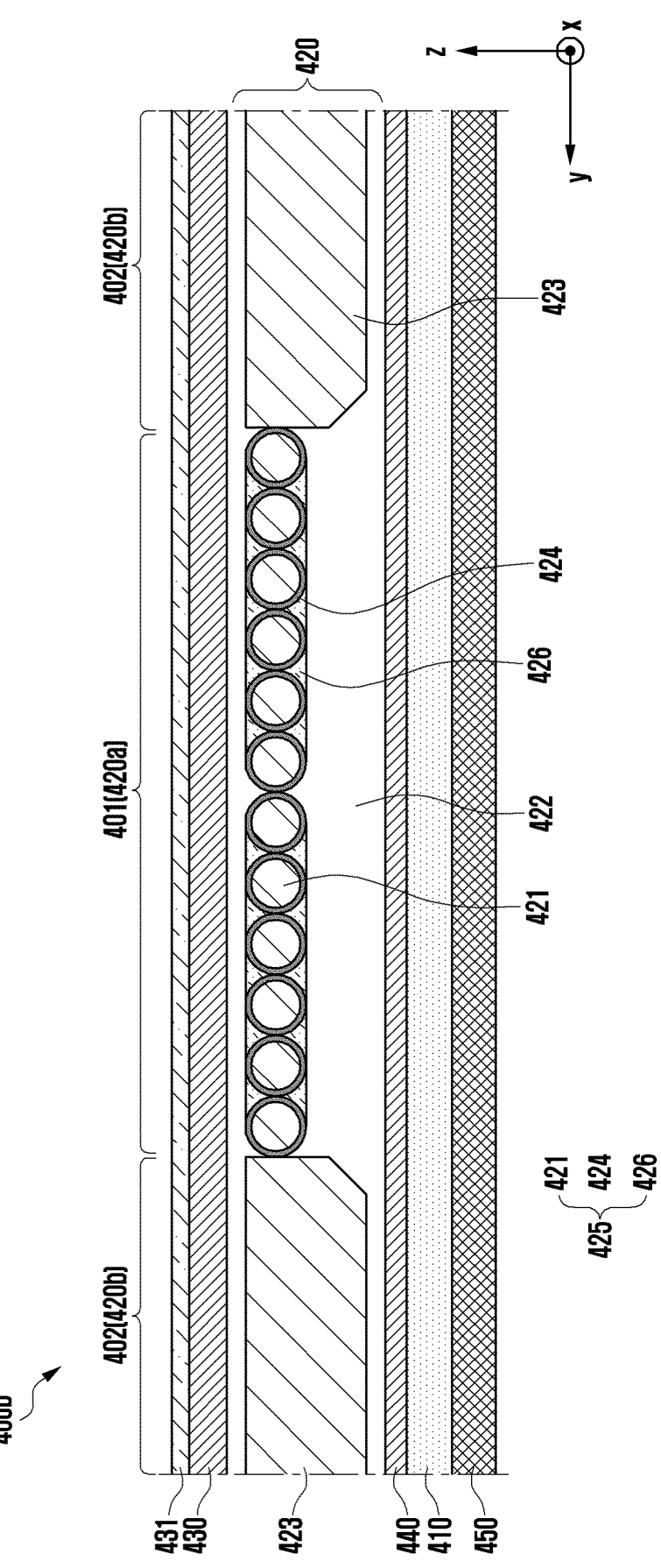
FIG. 9B is a cross-sectional view showing a flexible display according to an embodiment of the disclosure.

FIG. 9B is a cross-sectional view showing a flexible display 400a or 400b according to an embodiment of the disclosure.

Figure 9C:
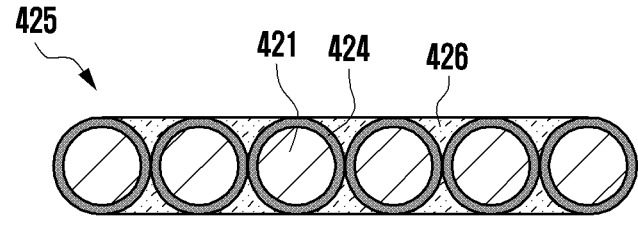
FIG. 9C is a cross-sectional view showing an elongated glass member of a flexible display according to an embodiment of the disclosure.
Figure 9C:
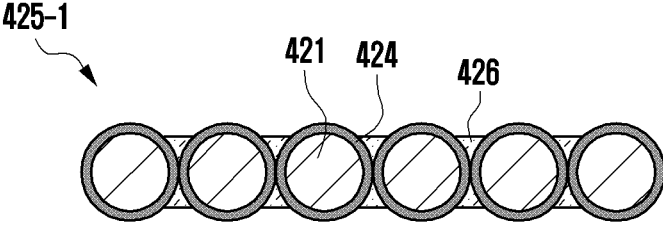
Figure 9C:
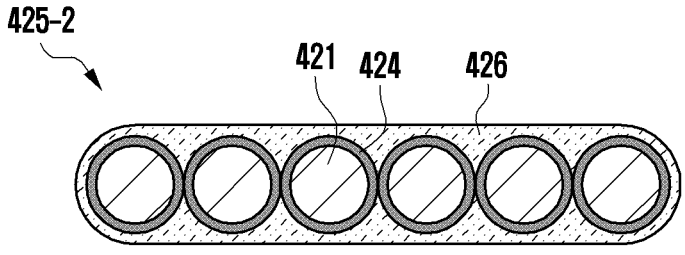

FIG. 9C is a cross-sectional view showing an elongated glass member 421 of a flexible display 400a or 400b according to an embodiment of the disclosure.

Referring to FIGS. 9A, 9B, and 9C, the flexible display 400a or 400b may include a polymer coating layer 424 which surrounds each of the elongated glass members 421, and a bundling member 426 which surrounds and bundles the outer perimeter of the multiple elongated glass members 421. Configurations and effects of the polymer coating layer 424 and the bundling member 426 may refer to the descriptions in FIGS. 7A, 7B, 7C, 8A, 8B, and FIG. 8C insofar as there is no contradiction therebetween. The elongated glass member 421, the polymer coating layer 424, the bundling member 426, and the optically transparent polymer 422 may have similar or substantially the same optical properties such as a refractive index and/or a dispersion index. The optically transparent polymer 422, the bundling member 426, and the polymer coating layer 424 may have elastic moduli gradually increased or decreased. Therefore, in case that an external impact is applied, the impact force may be transferred from a region having a low elastic modulus to a region having a high elastic modulus so that the impact force gradually decreases, thereby effectively reinforcing the rigidity of the elongated glass member 421.

Referring to FIG. 9C, according to an embodiment of the disclosure, the thickness of the bundle 425 may be the same as the diameter of the elongated glass member 421 coated with the coating layer 424, and the bundling member 426 may be filled in the spaces between the multiple elongated glass members 421 so as to attach the multiple elongated glass members 421 to each other. According to another embodiment of the disclosure, a bundle 425-1 may include a bundling member 426 positioned in a part of the space between the multiple elongated glass members 421. According to another embodiment of the disclosure, the thickness of a bundle 425-2 may be greater than the diameter of the elongated glass member 421, and a bundling member 426 may entirely surround the multiple elongated glass members 421 at the outer perimeter thereof.

Figure 10A:
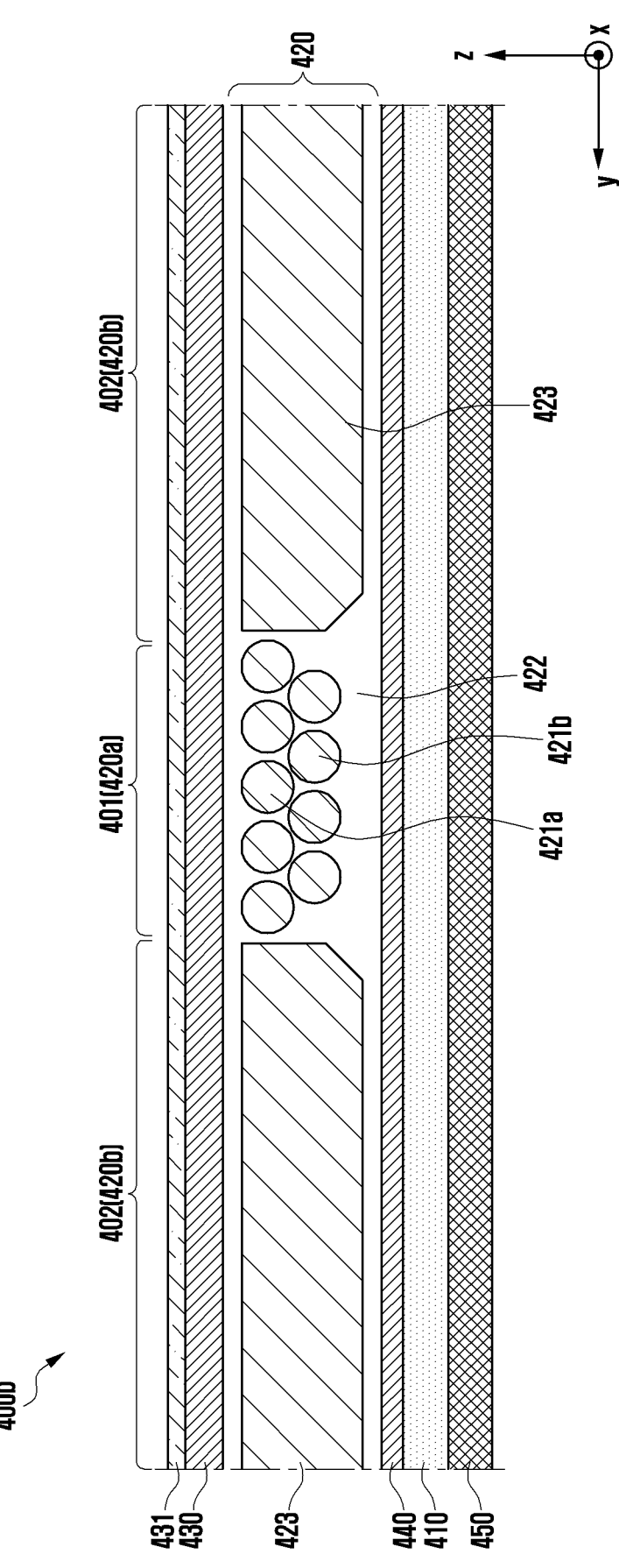
FIG. 10A is a cross-sectional view showing a flexible display according to an embodiment of the disclosure.

FIG. 10A is a cross-sectional view showing a flexible display according to an embodiment of the disclosure.

Figure 10B:
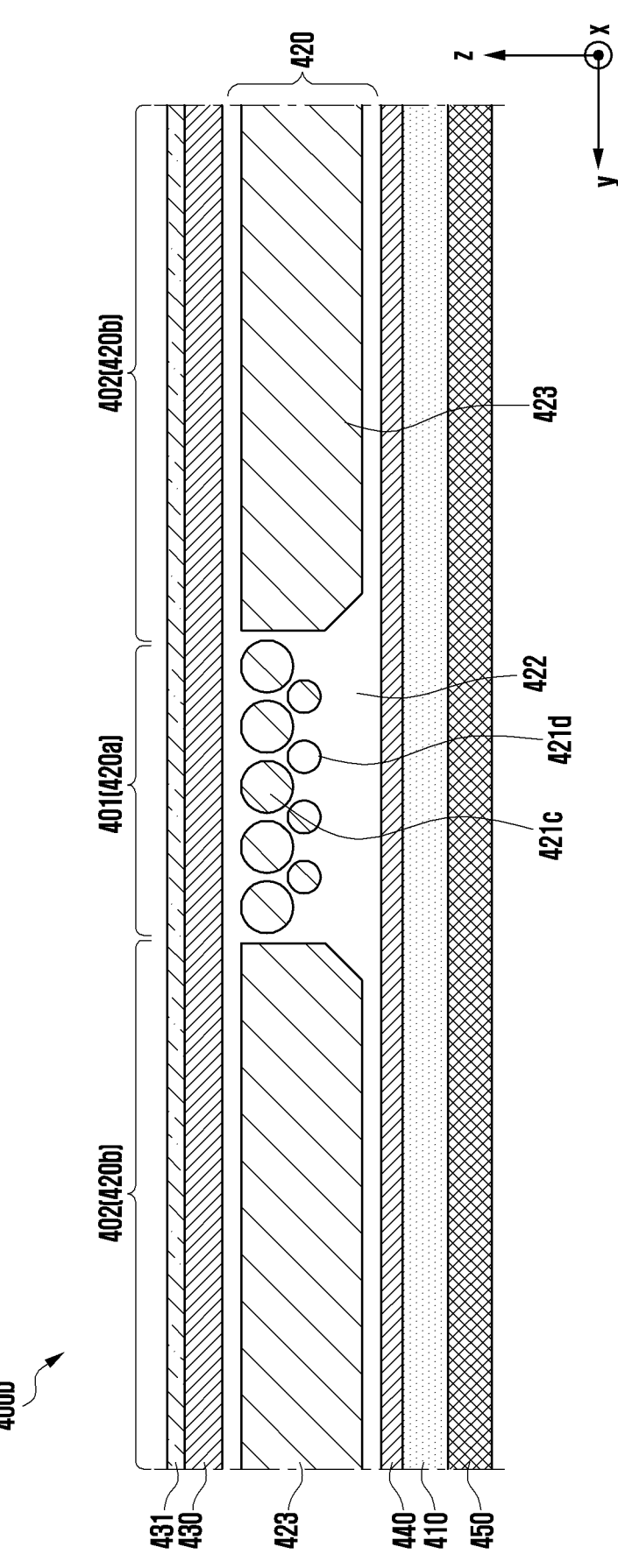
FIGS. 10B and 10C are cross-sectional views showing a flexible display according to various embodiments of the disclosure.

FIG. 10B is a cross-sectional view showing a flexible display according to an embodiment of the disclosure.

Figure 10C:
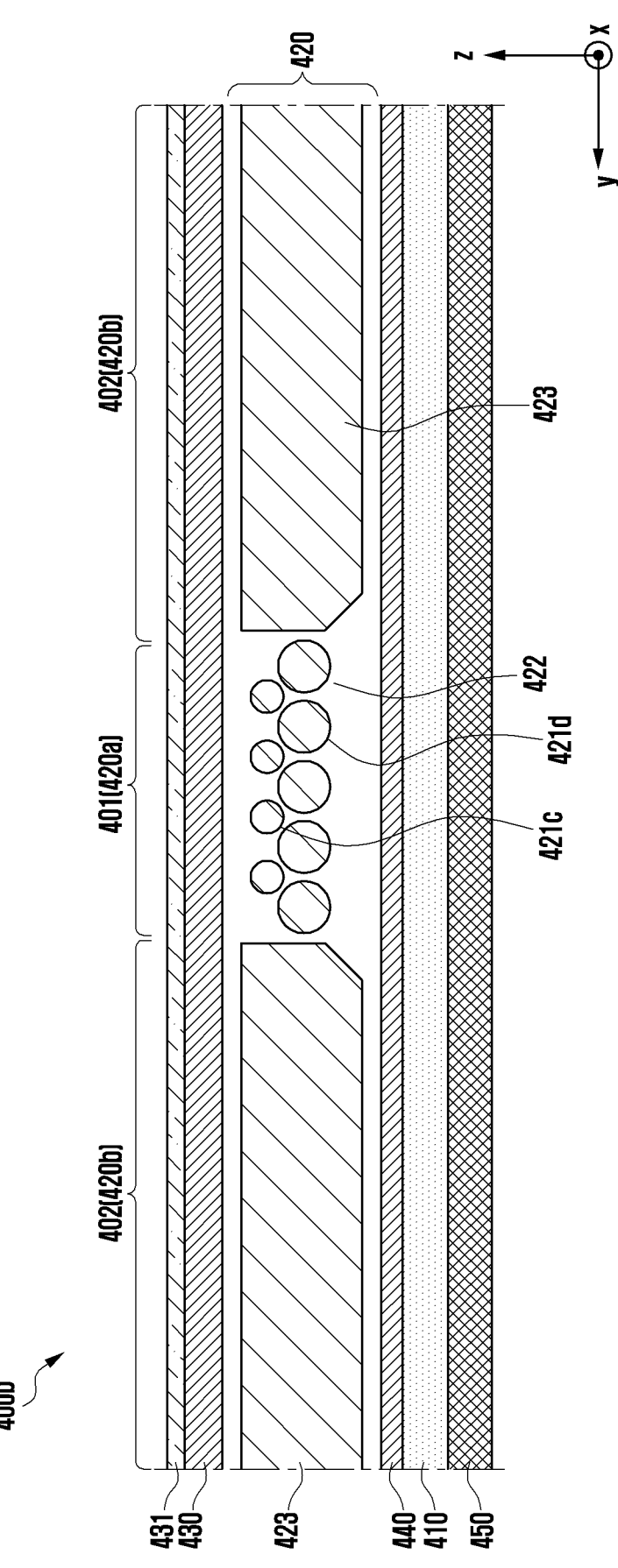

FIG. 10C is a cross-sectional view showing a flexible display according to an embodiment of the disclosure.

Figure 10D:
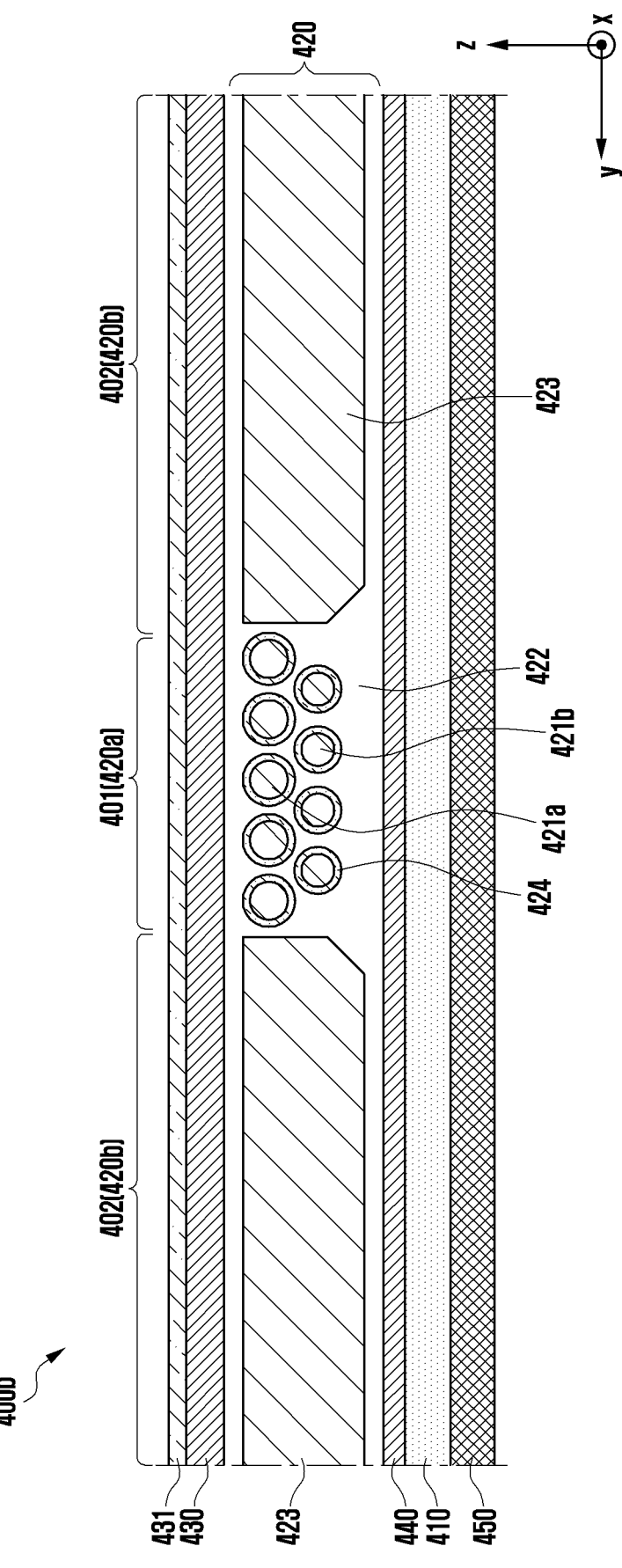
FIG. 10D is a cross-sectional view showing a flexible display according to an embodiment of the disclosure.

FIG. 10D is a cross-sectional view showing a flexible display according to an embodiment of the disclosure.

Figure 10E:
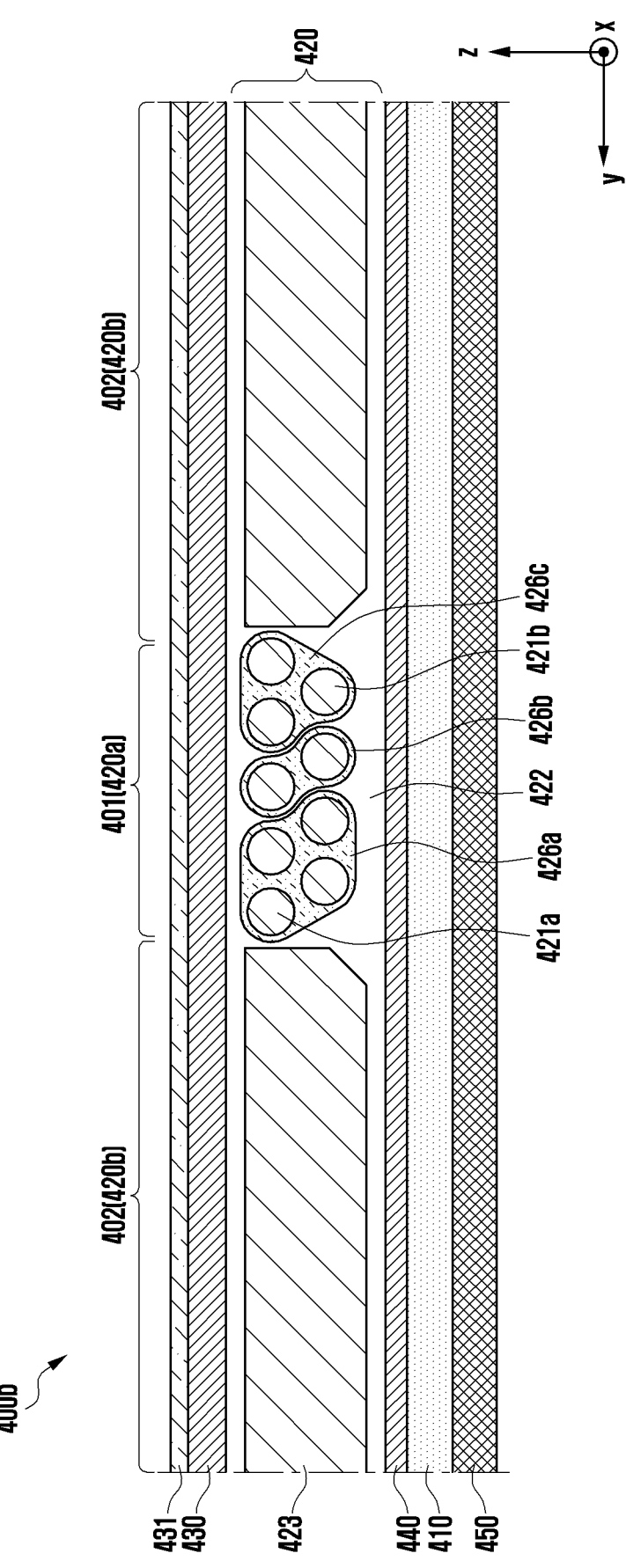
FIG. 10E is a cross-sectional view showing a flexible display according to an embodiment of the disclosure.

FIG. 10E is a cross-sectional view showing a flexible display according to an embodiment of the disclosure.

Referring to FIG. 10A, the elongated glass members 421 may be arranged in a plurality of layers. For example, the flexible display 400b, based on a direction (e.g., the z-direction) in which the image of the flexible display 400b is displayed, may include an upper elongated glass member 421a including multiple elongated glass members 421 arranged in the upper part of the flexible display and a lower elongated glass member 421b disposed under the upper elongated glass member 421a. Although FIG. 10A illustrates a configuration in which the elongated glass members 421 are arranged in two layers, it may be exemplary, and the disclosure is not limited thereto. In addition, it will be apparent to a person skilled in the art that the elongated glass members 421 may be stacked in multiple layers of three or more layers. In order to increase a density of the elongated glass members 421, the lower elongated glass members 421b may be alternately arranged with the upper elongated glass members 421a. In another embodiments, the lower elongated glass 421b may be disposed directly below the upper elongated glass 421a when viewed in the image display direction (z direction) to reinforce the upper elongated glass 421a. The elongated glass members 421 of the flexible display 400b may be stacked in multiple layers including the upper elongated glass member 421a and the lower elongated glass member 421b so that the rigidity and/or impact resistance of the first part 401 is improved. According to an embodiment of the disclosure, as illustrated in FIG. 10B, the upper and the lower elongated glass members 421a and 421b may have diameters smaller than those of the elongated glass members 421 arranged in a single layer. For example, the diameters of the upper and the lower elongated glass members may be 30 to 300 μm.

Referring to FIGS. 10B and 10C, the flexible display 400b may include a first elongated glass member 421c and a second elongated glass member 421d having different diameters. Referring to FIG. 10B, the first elongated glass member 421c may have a greater diameter compared to the second elongated glass member 421d. For example, the diameter of the first elongated glass member 421c may be 30 to 300 μm, and the diameter of the second elongated glass member 421*d* may be 30 to 200 µm. Referring to FIG. 10B, the first and the second elongated glass members 421*c* and 421*d* of the flexible display 400*b* may be arranged such that at least a part of each of the second elongated glass members 421*d* is inserted in each of the gaps formed between the first elongated glass members 421*c*. The first elongated glass member 421*c* and the second elongated glass member 421*d* included therein may have different diameters and thus be arranged at high density, so that the rigidity and/or impact resistance of the first part 401 is improved.

Referring to FIG. 10C, in another embodiment, the first elongated glass member 421*c* may have a smaller diameter compared to the second elongated glass member 421*d*. In some embodiments, the first and the second elongated glass members 421*c* and 421*d* may be arranged such that at least a part of each of the first elongated glass members 421*c* is inserted in each of the gaps formed between the second elongated glass members 421*d*.

Referring to FIG. 10D, each of the first elongated glass members 421*a* and each of the second elongated glass members 421*b* of the flexible display 400*b* may be coated with a polymer coating layer 424. The effect according to the coating may refer to the descriptions of FIGS. 7A, 7B, and 7C insofar as there is no contradiction. When the flexible display 400*a* or 400*b* is manufactured, although the second elongated glass member 421*b* has a relatively high risk of damage during handling due to having a relatively thin thickness, the risk of damage may be reduced by the polymer coating layer 424.

Referring to FIG. 10E, the flexible display 400*b* may include multiple bundling members 426*a*, 426*b*, and 426*c* in which at least two of the upper elongated glass members 421*a* and at least two of the lower elongated glass members 421*b* are bundled together. Although FIG. 10E illustrates three bundling members 426*a*, 426*b*, and 426*c*, the disclosure is not limited thereto. The bundling members 426*a*, 426*b*, and 426*c* may be formed by the upper and the lower elongated glass members 421*a* and 421*b*, which are surrounded and bundled, to reduce an upward/downward (the z-axis direction) movement of the elongated glass members 421 including multiple layers and secure the flexibility and rigidity of the first part 420*a*.

Although FIGS. 10A to 10E illustrate embodiments of the flexible display 400*b* in FIG. 6B, it will be apparent that the description of the above-described technical features of the flexible display 400*b* in FIG. 6B is also applicable to the flexible display 400*a* in FIG. 6A.

Figure 11A:
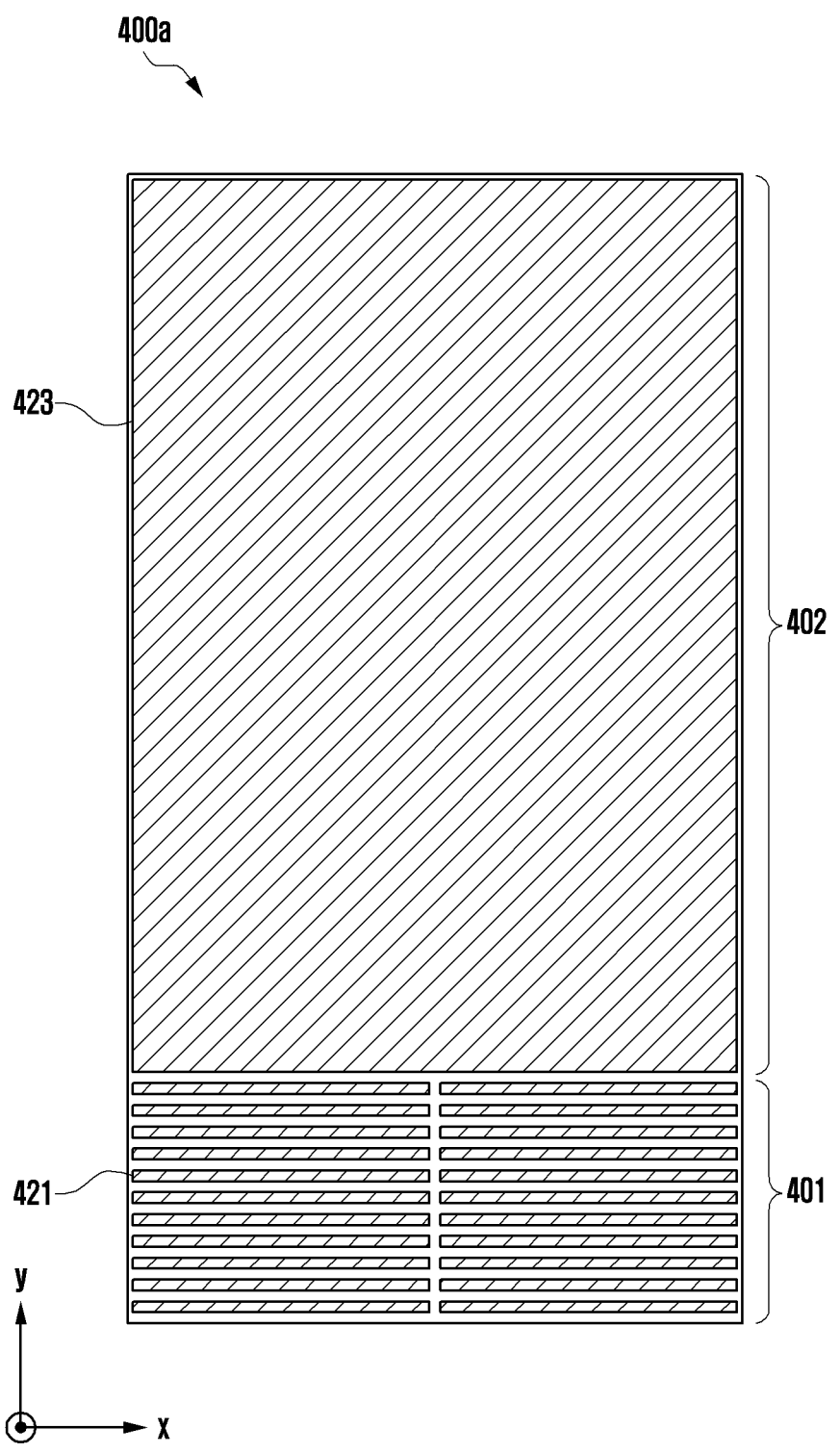
FIGS. 11A and 11B are plan views illustrating a flexible window 420 according to various embodiments of the disclosure.
Figure 11B:
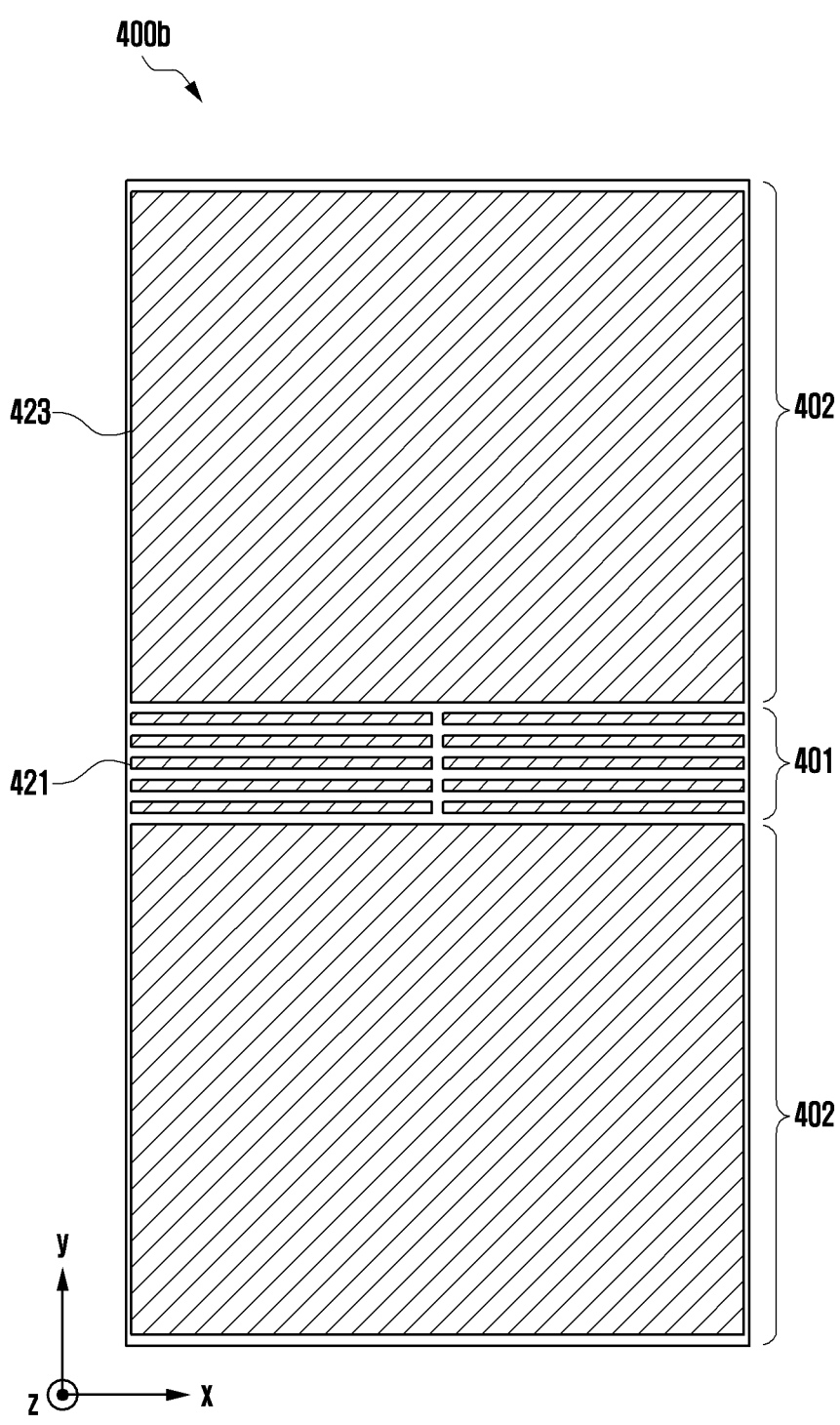

FIGS. 11A and 11B are plan views illustrating a flexible window 420 according to various embodiments of the disclosure.

Referring to FIGS. 11A and 11B, the length of the elongated glass member 421 is less than half the width of the flexible window (e.g., the width in the x-axis direction), and two or more elongated glass members 421 may be arranged adjacent to each other end-to-end. FIGS. 11A and 11B show an embodiment in which the length of the elongated glass member 421 with a length half of the width of the flexible window 420, but the present invention is not limited thereto, and it will be apparent to those skilled in the art that three, four or more elongated glass members 421 may be arranged end-to-end in width direction of the flexible window 420. As the length of the elongated glass member 421 increases, the risk of breakage during manufacture or in actual use case of an electronic device may increase. Accordingly, the risk of breakage of the elongated glass member 421 may be reduced by reducing the length of the elongated glass member 421, as shown in FIGS. 11A and 11B.

An electronic device 101, 200, 300 according to various embodiments of the current disclosure may comprise: a flexible display panel 410 configured to display an image; and a flexible window module 420 disposed on the flexible display panel 410, wherein the flexible window module 420 may comprise: a plurality of elongated glass members 421 parallel with respect to each other; a flat-plate glass member 423; and a first polymer layer (e.g. an optically transparent polymer 422), wherein the elongated glass members 421 and the flat-plate glass member 423 are embedded in the first polymer layer.

In various embodiments, each of the elongated glass members 421 may be cylinder shaped.

In various embodiments, each of the elongated glass members 421 may have diameter between 30 to 450 µm.

In various embodiments, each of the elongated glass members 421 may have diameter between 150 to 300 µm.

In various embodiments, each of the elongated glass members 421 may have a length that is less than one-half of the width of the flat-plate glass member 423.

In various embodiments, the electronic device 101, 200, 300 may comprise a second polymer layer (e.g. polymer coating layer 424) coated on an outer surface of at least one of the elongated glass members 421.

In various embodiments, the second polymer layer may have an elastic modulus different from the first polymer layer.

In various embodiments, the electronic device 101, 200, 300 may comprise a bundling member 426 configured to group at least some of the plurality of elongated glass members 421.

In various embodiments, the bundling member 426 may have an elastic modulus different from the first polymer layer.

In various embodiments, the elongated glass members 421 may comprise first elongated glass members 421 and second elongated glass members 421 having a smaller diameter than the first elongated glass members 421.

A transparent panel 420 according to various embodiments of the current disclosure may be a transparent panel 420 for use with a display panel, the transparent panel 420 may comprise: a plurality of elongated glass members 421 oriented parallel with respect to each other; and an optically transparent polymer 422, wherein the elongated glass members 421 are embedded in the optically transparent polymer 422.

In various embodiments, each of the elongated glass members 421 may be cylinder shaped.

In various embodiments, each of the elongated glass members 421 may have diameter between 30 to 450 µm.

In various embodiments, each of the elongated glass members 421 may have diameter between 150 to 300 µm.

In various embodiments, the transparent panel 420 may further comprise a flat-plate glass member 423, wherein the elongated glass members 421 embedded in the optically transparent polymer 422 form a flexible part, which is integrally formed with the flat-plate glass member 423.

In various embodiments, the transparent panel 420 may have a rectangular plate shape having a length, a width and a thickness, wherein each of the elongated glass members 421 may have a length that is less than one-half of the width of the rectangular plate shape.

In various embodiments, the transparent panel 420 may have a rectangular plate shape having a length, a width and a thickness, wherein each of the elongated glass members may have a length that is less than one-fourth of the width of the rectangular plate shape.

In various embodiments, the transparent panel 420 may comprise a polymer coating layer coated on an outer perimeter surface of at least one of the elongated glass members 421.

In various embodiments, the polymer coating layer may have an elastic modulus different from the optically transparent polymer 422.

In various embodiments, the transparent panel 420 may comprise a bundling member 426 configured to group at least some of the plurality of elongated glass members 421.

In various embodiments, the bundling member 426 may have an elastic modulus different from the optically transparent polymer 422.

In various embodiments, the plurality of elongated glass members 421 may be arranged, based on a direction in which the image of the flexible display is displayed, in a plurality of layers.

In various embodiments, the elongated glass members 421 may comprise first elongated glass members 421 and second elongated glass members 421 having a smaller diameter than the first elongated glass members 421.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a flexible display panel configured to display an image; and
   a flexible window module disposed on the flexible display panel,
   wherein the flexible window module comprises:
      a plurality of elongated glass members parallel with respect to each other,
      a flat-plate glass member, and
      a first polymer layer, and
   wherein the plurality of elongated glass members and the flat-plate glass member are completely embedded in the first polymer layer.

2. The electronic device of claim 1, wherein each of the plurality of elongated glass members is cylinder shaped.

3. The electronic device of claim 2, wherein each of the plurality of elongated glass members has diameter between 30 to 450 μm.

4. The electronic device of claim 2, wherein each of the plurality of elongated glass members has diameter between 150 to 300 μm.

5. The electronic device of claim 1, wherein each of the plurality of elongated glass members has a length that is less than one-half of a width of the flat-plate glass member.

6. The electronic device of claim 1, comprising:
   a second polymer layer coated on an outer surface of at least one of the plurality of elongated glass members.

7. The electronic device of claim 6, wherein the second polymer layer has an elastic modulus different from the first polymer layer.

8. The electronic device of claim 1, comprising:
   a bundling member configured to group at least some of the plurality of elongated glass members.

9. The electronic device of claim 8, wherein the bundling member has an elastic modulus different from the first polymer layer.

10. The electronic device of claim 1, wherein the plurality of elongated glass members comprise first elongated glass members and second elongated glass members having a smaller diameter than the first elongated glass members.

11. A transparent panel for use with a display panel, the transparent panel comprising:
   a plurality of elongated glass members oriented parallel with respect to each other;
   a flat-plate glass member; and
   an optically transparent polymer,
   wherein the plurality of elongated glass members and the flat-plate glass member are completely embedded in the optically transparent polymer.

12. The transparent panel of claim 11, wherein each of the plurality of elongated glass members is cylinder shaped.

13. The transparent panel of claim 11, wherein each of the plurality of elongated glass members has diameter between 30 to 450 μm.

14. The transparent panel of claim 11, wherein each of the plurality of elongated glass members has diameter between 150 to 300 μm.

15. The transparent panel of claim 11,
   wherein the plurality of elongated glass members and the flat-plate glass member embedded in the optically transparent polymer form a flexible part.

16. The transparent panel of claim 11,
   wherein the transparent panel has a rectangular plate shape having a length, a width and a thickness, and
   wherein each of the plurality of elongated glass members has a length that is less than one-half of the width of the rectangular plate shape.

17. The transparent panel of claim 11,
   wherein the transparent panel has a rectangular plate shape having a length, a width and a thickness, and
   wherein each of the plurality of elongated glass members has a length that is less than one-fourth of the width of the rectangular plate shape.

18. The transparent panel of claim 11, comprising:
   a polymer coating layer coated on an outer perimeter surface of at least one of the plurality of elongated glass members.

19. The transparent panel of claim 18, wherein the polymer coating layer has an elastic modulus different from the optically transparent polymer.

20. The transparent panel of claim 11, comprising:
   a bundling member configured to group at least some of the plurality of elongated glass members.

21. The transparent panel of claim 20, wherein the bundling member has an elastic modulus different from the optically transparent polymer.

22. The transparent panel of claim 11, wherein the plurality of elongated glass members are arranged, based on a direction in which an image is displayed on the display panel, in a plurality of layers.

23. The transparent panel of claim 11, wherein the plurality of elongated glass members comprise first elongated glass members and second elongated glass members having a smaller diameter than the first elongated glass members.

* * * * *